(12) United States Patent
Lin et al.

(10) Patent No.: US 11,887,546 B2
(45) Date of Patent: Jan. 30, 2024

(54) ELECTRONIC DISPLAY WITH HYBRID IN-PIXEL AND EXTERNAL COMPENSATION

(71) Applicant: Apple Inc., Cupertino, CA (US)

(72) Inventors: Chin-Wei Lin, San Jose, CA (US); Shinya Ono, Santa Clara, CA (US); Zino Lee, San Diego, CA (US); Yun Wang, Cupertino, CA (US); Fan Gui, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/192,905

(22) Filed: Mar. 30, 2023

(65) Prior Publication Data
US 2023/0237965 A1      Jul. 27, 2023

Related U.S. Application Data

(63) Continuation of application No. 17/680,059, filed on Feb. 24, 2022, now Pat. No. 11,651,736, which is a
(Continued)

(51) Int. Cl.
*G09G 3/3258*      (2016.01)
*H01L 29/786*      (2006.01)
*H10K 59/121*      (2023.01)

(52) U.S. Cl.
CPC ....... *G09G 3/3258* (2013.01); *H01L 29/7869* (2013.01); *H10K 59/1213* (2023.02);
(Continued)

(58) Field of Classification Search
CPC ......... G09G 3/3258; G09G 2300/0842; G09G 2320/0233; G09G 2320/043;
(Continued)

(56) References Cited

U.S. PATENT DOCUMENTS

| 8,411,016 | B2 | 4/2013 | Tanikame et al. |
| 8,514,152 | B2 * | 8/2013 | Park ..................... G09G 3/3233 345/82 |

(Continued)

FOREIGN PATENT DOCUMENTS

| CN | 102568374 A | 7/2012 |
| CN | 104332126 A | 2/2015 |

(Continued)

*Primary Examiner* — Rodney Amadiz
(74) *Attorney, Agent, or Firm* — Treyz Law Group; Jason Tsai

(57) ABSTRACT

A display pixel is provided that is operable to support hybrid compensation scheme having both in-pixel threshold voltage canceling and external threshold voltage compensation. The display may include multiple p-type silicon transistors with at least one n-type semiconducting-oxide transistor and one storage capacitor. An on-bias stress phase may be performed prior to a threshold voltage sampling and data programming phase to mitigate hysteresis and improve first frame response. In low refresh rate displays, a first additional on-bias stress operation can be performed separate from the threshold voltage sampling and data programming phase during a refresh frame and a second additional on-bias stress operation can be performed during a vertical blanking frame. The display pixel may be configured to receive an initialization voltage and an anode reset voltage, either of which can be dynamically tuned to match the stress of the first and second additional on-bias stress operations to minimize flicker.

19 Claims, 26 Drawing Sheets

Related U.S. Application Data continuation of application No. 17/062,786, filed on Oct. 5, 2020, now Pat. No. 11,282,462, which is a continuation of application No. 16/716,911, filed on Dec. 17, 2019, now Pat. No. 10,916,198.

(60) Provisional application No. 62/791,522, filed on Jan. 11, 2019.

(52) U.S. Cl.
CPC ........... *G09G 2300/0842* (2013.01); *G09G 2320/0233* (2013.01); *G09G 2320/043* (2013.01)

(58) Field of Classification Search
CPC ... G09G 2300/0819; G09G 2300/0861; G09G 2320/0295; G09G 3/3233; G09G 2300/0809; G09G 2310/0245; G09G 2310/06; G09G 2320/0693; G09G 3/32; H01L 29/7869; H10K 59/1213
See application file for complete search history.

(56) References Cited

U.S. PATENT DOCUMENTS

| | | | |
|---|---|---|---|
| 8,648,848 B2 | 2/2014 | Tsai et al. | |
| 9,224,908 B2 | 12/2015 | Kitazawa et al. | |
| 9,489,875 B2 | 11/2016 | Hwang et al. | |
| 9,558,692 B2 | 1/2017 | Kim et al. | |
| 9,747,835 B2 | 8/2017 | Lee et al. | |
| 10,262,585 B2 | 4/2019 | Senda et al. | |
| 10,283,045 B2 | 5/2019 | Shibusawa et al. | |
| 10,460,673 B2 | 10/2019 | Gao et al. | |
| 10,497,323 B2 | 12/2019 | Zhou et al. | |
| 10,672,338 B2 * | 6/2020 | Lin | H10K 59/124 |
| 10,679,558 B2 | 6/2020 | Ueda | |
| 10,916,198 B2 | 2/2021 | Lin et al. | |
| 10,957,256 B2 | 3/2021 | Kubota | |
| 11,158,256 B2 * | 10/2021 | Lin | G09G 3/3233 |
| 11,195,459 B2 | 12/2021 | Kobayashi | |
| 2006/0022305 A1 | 2/2006 | Yamashita | |
| 2006/0044236 A1 | 3/2006 | Kim | |
| 2010/0164847 A1 | 7/2010 | Lee et al. | |
| 2011/0050659 A1 | 3/2011 | Tsai et al. | |
| 2011/0221791 A1 * | 9/2011 | Kajiyama | G09G 3/3233 345/77 |
| 2012/0062536 A1 | 3/2012 | Park | |
| 2013/0194248 A1 | 8/2013 | Kim | |
| 2014/0368492 A1 | 12/2014 | Fujioka et al. | |
| 2015/0279269 A1 | 10/2015 | Ishii et al. | |
| 2016/0063921 A1 | 3/2016 | Tsai et al. | |
| 2016/0124491 A1 | 5/2016 | An et al. | |
| 2016/0125808 A1 | 5/2016 | Hsu et al. | |
| 2016/0140897 A1 | 5/2016 | Park et al. | |
| 2016/0163278 A1 | 6/2016 | Pappas et al. | |
| 2016/0189610 A1 | 6/2016 | Xiao et al. | |
| 2016/0267844 A1 | 9/2016 | Senda et al. | |
| 2016/0321995 A1 | 11/2016 | Shin | |
| 2016/0351124 A1 | 12/2016 | Kim et al. | |
| 2016/0379552 A1 | 12/2016 | Kim et al. | |
| 2017/0243537 A1 | 8/2017 | Wu et al. | |
| 2017/0278459 A1 | 9/2017 | Jeon | |
| 2017/0365213 A1 | 12/2017 | Rieutort-Louis et al. | |
| 2018/0061317 A1 | 3/2018 | Morita et al. | |
| 2018/0061915 A1 | 3/2018 | Yu | |
| 2018/0130409 A1 | 5/2018 | Xiang et al. | |
| 2018/0130424 A1 | 5/2018 | Gao et al. | |
| 2018/0166025 A1 | 6/2018 | Zhou et al. | |
| 2018/0226025 A1 | 8/2018 | Wu et al. | |
| 2018/0357960 A1 | 12/2018 | Yang et al. | |
| 2019/0096327 A1 | 3/2019 | Peng et al. | |
| 2019/0103055 A1 | 4/2019 | Gao | |
| 2019/0130833 A1 | 5/2019 | Gao et al. | |
| 2019/0130846 A1 | 5/2019 | Chung et al. | |
| 2019/0131376 A1 | 5/2019 | Hong et al. | |
| 2019/0147796 A1 | 5/2019 | Rha et al. | |
| 2019/0154439 A1 | 5/2019 | Binder | |
| 2019/0259325 A1 | 8/2019 | Chaji et al. | |
| 2019/0287452 A1 | 9/2019 | Wang | |
| 2019/0295469 A1 | 9/2019 | Umezawa et al. | |
| 2021/0201760 A1 * | 7/2021 | Wang | G09G 3/3233 |
| 2023/0206858 A1 * | 6/2023 | Kim | G09G 3/3275 345/204 |

FOREIGN PATENT DOCUMENTS

| | | |
|---|---|---|
| CN | 206210357 U | 5/2017 |
| CN | 106910460 A | 6/2017 |
| CN | 106959789 A | 7/2017 |
| CN | 107211066 A | 9/2017 |
| CN | 107799057 A | 3/2018 |
| CN | 108053792 A | 5/2018 |
| CN | 108492779 A | 9/2018 |
| CN | 108877674 A | 11/2018 |
| CN | 109087610 A | 12/2018 |
| EP | 2602783 B1 | 7/2018 |
| EP | 2852947 B1 | 7/2018 |
| JP | 2012014136 A | 1/2012 |
| JP | 2012128386 A | 7/2012 |
| JP | 2014032379 A | 2/2014 |
| JP | 2017187608 A | 10/2017 |
| JP | 2018005237 A | 1/2018 |
| JP | 2018032033 A | 3/2018 |
| JP | 2018112741 A | 7/2018 |
| KR | 20180004369 A | 1/2018 |
| KR | 20180025182 A | 3/2018 |
| KR | 20180025482 A | 3/2018 |
| KR | 20180056442 A | 5/2018 |
| WO | 2019006851 A1 | 1/2019 |

* cited by examiner

ELECTRONIC DISPLAY WITH HYBRID IN-PIXEL AND EXTERNAL COMPENSATION

This application is a continuation of patent application Ser. No. 17/680,059, filed Feb. 24, 2022, which is a continuation of patent application Ser. No. 17/062,786, filed Oct. 5, 2020, now U.S. Pat. No. 11,282,462, which is a continuation of patent application Ser. No. 16/716,911, filed Dec. 17, 2019, now U.S. Pat. No. 10,916,198, which claims the benefit of provisional patent application No. 62/791,522, filed Jan. 11, 2019, all of which are hereby incorporated by reference herein in their entireties.

BACKGROUND

This relates generally to electronic devices with displays and, more particularly, to display driver circuitry for displays such as organic-light-emitting diode displays.

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode to produce light.

An organic light-emitting diode display pixel includes a drive thin-film transistor connected to a data line via an access thin-film transistor. The access transistor may have a gate terminal that receives a scan signal via a corresponding scan line. Image data on the data line can be loaded into the display pixel by asserting the scan signal to turn on the access transistor. The display pixel further includes a current source transistor that provides current to the organic light-emitting diode to produce light.

Transistors in an organic light-emitting diode display pixel may be subject to process, voltage, and temperature (PVT) variations. Due to such variations, transistor threshold voltages between different display pixels may vary. Variations in transistor threshold voltages can cause the display pixels to produce amounts of light that do not match a desired image. It is within this context that the embodiments herein arise.

SUMMARY

An electronic device may include a display having an array of display pixels. The display pixels may be organic light-emitting diode display pixels. Each display pixel may include an organic light-emitting diode (OLED) that emits light, a drive transistor coupled in series with the OLED, first and second emission transistors coupled in series with the drive transistor and the OLED, a semiconducting-oxide transistor coupled between gate and drain terminals of the drive transistor, a single storage capacitor coupled to the gate terminal of the drive transistor, a data loading transistor coupled between the source terminal of the drive transistor and a data line, an initialization transistor coupled to the drain terminal of the drive transistor, and an anode reset transistor coupled to the anode terminal of the OLED. The semiconducting-oxide transistor may be an n-type transistor, whereas all remaining transistors in the pixel may be p-type silicon transistors (e.g., PMOS LTPS thin-film transistors).

During normal operation, a display pixel may undergo an initialization phase during which the initialization transistor and/or the anode reset transistor is turned on to reset the display pixel. The initialization phase may be followed by one or more on-bias stress phases during which the data loading transistor is activated to load a data voltage at least partially onto the drive transistor. The on-bias stress phase may be automatically followed by a threshold voltage sampling and data loading phase, which is then followed by an emission phase. During the emission phase, the current flowing through the OLED will be independent of the drive transistor threshold voltage due to in-pixel threshold voltage cancellation.

Performing the on-bias stress phase prior to the threshold voltage sampling can help mitigate any undesired hysteresis effects and improve first frame response. If desired, the emission phase can be optionally shortened to help reduce potential mismatch between the negative bias temperature stress (NBTS) and the positive bias temperature stress (PBTS) associated with the semiconducting-oxide transistor. If desired, the semiconducting-oxide transistor can also be turned on when the data loading transistor is turned on to lengthen the on-bias stress phase. The display pixel is also operable to support external current sensing (e.g., by turning on the data loading transistor and the initialization transistor) while the display is off or idle.

The display pixel may also be configured to support low refresh rate operation (e.g., 1 Hz, 2 Hz, less than 30 Hz, less than 60 Hz, etc.). For low refresh rate operation, a short refresh period is followed by a much longer vertical blanking period. During the refresh period, a first on-bias stress phase may be performed immediately followed by a first threshold voltage sampling and data programming phase; a second on-bias stress phase may be performed after the first threshold voltage sampling and data programming phase; and a third on-bias stress phase may then be performed after the second on-bias stress phase, which is immediately followed by a second threshold voltage sampling and data programming phase. An emission phase can then follow the second threshold voltage sampling and data programming phase.

During the vertical blanking period, at least a fourth on-bias stress phase that matches the second on-bias stress phase can be performed to reduce flicker. The initialization voltage may be dynamically adjusted during the second and fourth on-bias stress phases to minimize any potential mismatch. The anode reset voltage may also be dynamically adjusted when switching from the refresh period to the vertical blanking period to help improve low refresh rate performance.

DETAILED DESCRIPTION

Figure 1:
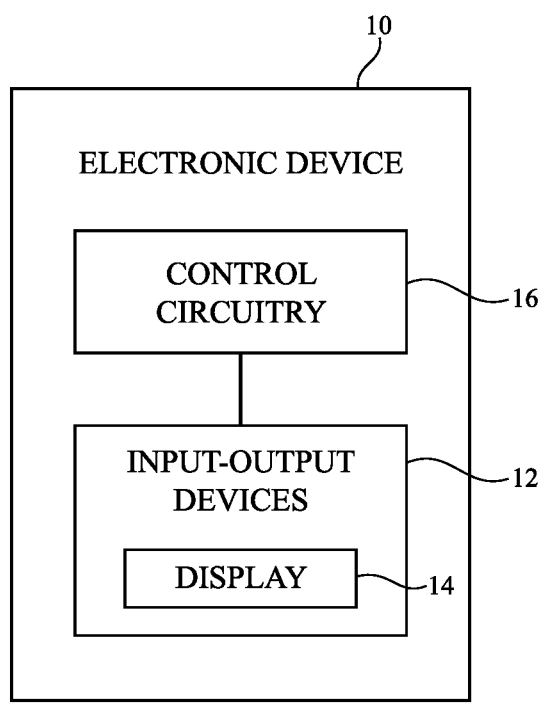
FIG. 1 is a diagram of an illustrative electronic device having a display in accordance with an embodiment.

An illustrative electronic device of the type that may be provided with an organic light-emitting diode (OLED) display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application-specific integrated circuits, programmable integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 in input-output devices.

Figure 2:
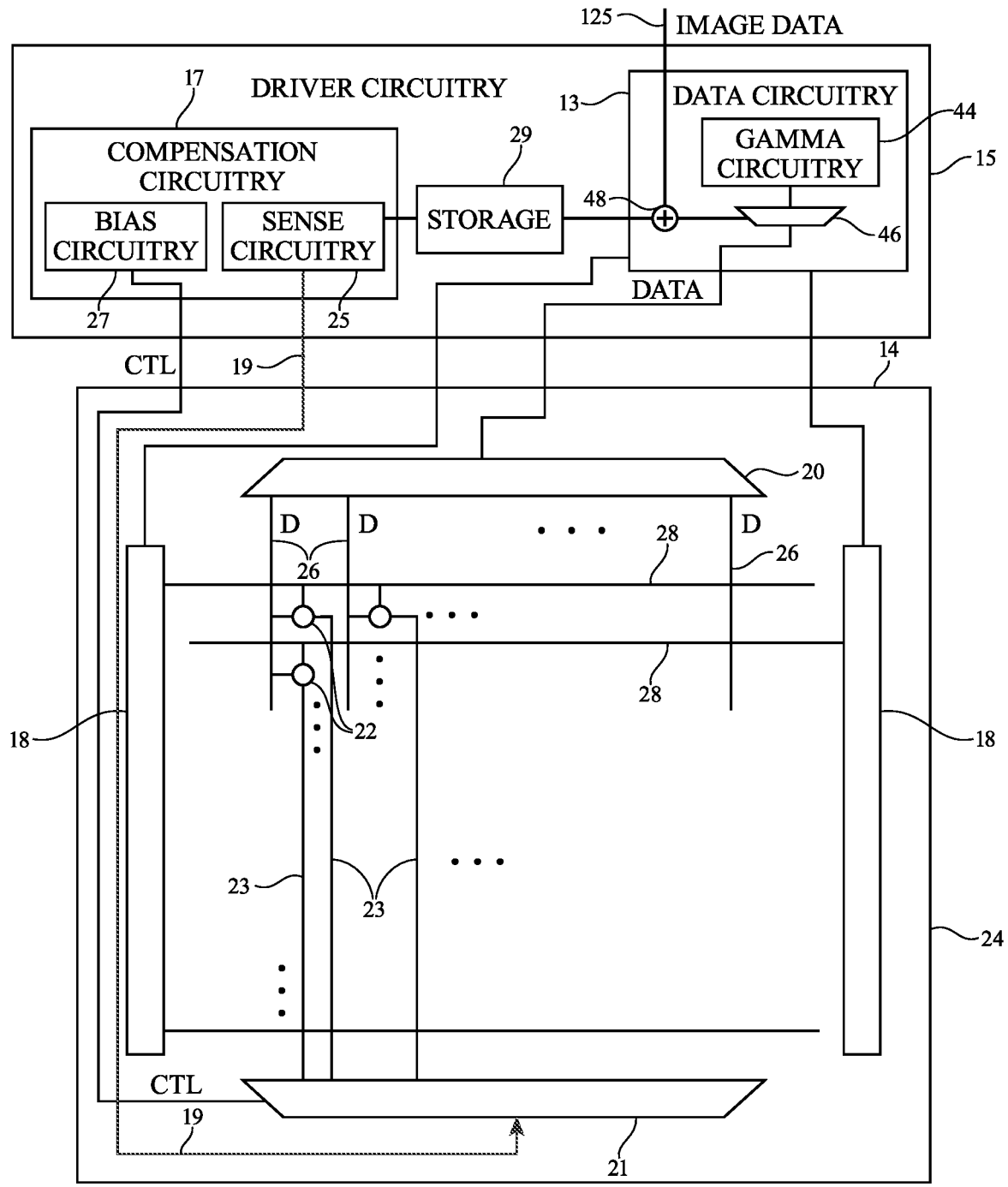
FIG. 2 is a diagram of an illustrative display having an array of organic light-emitting diode display pixels coupled to compensation circuitry in accordance with an embodiment.

FIG. 2 shows display 14 and associated display driver circuitry 15. Display 14 includes structures formed on one or more layers such as substrate 24. Layers such as substrate 24 may be formed from planar rectangular layers of material such as planar glass layers. Display 14 may have an array of display pixels 22 for displaying images to a user. The array of display pixels 22 may be formed from rows and columns of display pixel structures on substrate 24. These structures may include thin-film transistors such as polysilicon thin-film transistors, semiconducting oxide thin-film transistors, etc. There may be any suitable number of rows and columns in the array of display pixels 22 (e.g., ten or more, one hundred or more, or one thousand or more).

Display driver circuitry such as display driver integrated circuit 15 may be coupled to conductive paths such as metal traces on substrate 24 using solder or conductive adhesive. If desired, display driver integrated circuit 15 may be coupled to substrate 24 over a path such as a flexible printed circuit or other cable. Display driver integrated circuit 15 (sometimes referred to as a timing controller chip) may contain communications circuitry for communicating with system control circuitry 16 over path 125. Path 125 may be formed from traces on a flexible printed circuit or other cable. Control circuitry 16 (see FIG. 1) may be located on a main logic board in an electronic device such as a cellular telephone, computer, television, set-top box, media player, portable electronic device, or other electronic equipment in which display 14 is being used.

During operation, the control circuitry may supply display driver integrated circuit 15 with information on images to be displayed on display 14. To display the images on display pixels 22, display driver integrated circuit 15 may supply clock signals and other control signals to display driver circuitry such as row driver circuitry 18 and column driver circuitry 20. For example, data circuitry 13 may receive image data and process the image data to provide pixel data signals to display 14. The pixel data signals may be demultiplexed by column driver circuitry 20 and pixel data signals D may be routed to each pixel 22 over data lines 26 (e.g., to each red, green, or blue pixel). Row driver circuitry 18 and/or column driver circuitry 20 may be formed from one or more integrated circuits and/or one or more thin-film transistor circuits.

Display driver integrated circuit 15 may include compensation circuitry 17 that helps to compensate for variations among display pixels 22 such as threshold voltage variations. Compensation circuitry 17 may, if desired, also help compensate for transistor aging. Compensation circuitry 17 may be coupled to pixels 22 via path 19, switching circuitry 21, and paths 23. Compensation circuitry 17 may include sense circuitry 25 and bias circuitry 27. Sense circuitry 25 may be used in sensing (e.g., sampling) voltages from pixels 22. During sense operations, switching circuitry 21 may be configured to electrically couple sense circuitry 25 to one or more selected pixels 22. For example, compensation circuitry 17 may produce control signal CTL to configure switching circuitry 21. Sense circuitry 25 may sample currents, voltages or other desired signals from the pixels over path 19, switching circuitry 21, and paths 23. Bias circuitry 27 may include one or more driver circuits for driving reference or bias voltages onto nodes of pixels 22. For example, switching circuitry 21 may be configured to electrically couple path 19 to one or more selected pixels 22. In this scenario, bias circuitry 27 may provide reference signals to the selected pixels. The reference signals may bias nodes at the selected pixels at desired voltages for the sensing operations performed by sense circuitry 25.

Compensation circuitry 17 may perform compensation operations on pixels 22 using bias circuitry 27 and sense circuitry 25 to generate compensation data that is stored in storage 29. Storage 29 may, for example, be static random-access memory (SRAM). In the example of FIG. 2, storage 29 is on-chip storage. If desired, storage 29 may be off-chip storage such as non-volatile storage (e.g., non-volatile memory that maintains stored information even when the display is powered off). The compensation data stored in storage 29 may be retrieved by data circuitry 13 during display operations. Data circuitry 13 may process the compensation data along with incoming digital image data to generate compensated data signals for pixels 22.

Data circuitry 13 may include gamma circuitry 44 that provides a mapping of digital image data to analog data signals at appropriate voltage levels for driving pixels 22. Multiplexer 46 receives a set of possible analog data signals from gamma circuitry 44 and is controlled by the digital image data to select an appropriate analog data signal for the digital image data. Compensation data retrieved from storage 29 may be added to (or subtracted from) the digital image data by adder circuit 48 to help compensate for transistor variations (e.g., threshold voltage variations, transistor aging variations, or other types of variations) between different display pixels 22. This example in which compensation data is added as an offset to digital input image data is merely illustrative. In general, data circuitry 13 may process compensation data along with image data to produce compensated analog data signals for driving pixels 22.

In contrast to techniques that focus on performing in-pixel threshold canceling (such as by performing an initialization phase followed by a threshold sampling phase), performing sensing and compensation in this way using compensation circuitry 17 outside of each pixel 22 allows for higher refresh rates (e.g., greater than 60 Hz refresh rate, at least 120 Hz refresh rate, etc.) and is sometimes referred to as "external" compensation. External variation compensation may be performed in the factory, in real time (e.g., during blanking intervals between successive image frames), or when the display is idle (as examples). In accordance with at least some embodiments, display 14 may be operated using a hybrid compensation scheme in which in-pixel threshold canceling is implemented during normal display operation and external threshold compensation is implemented while display 14 is turned off. Configured in this way, the in-pixel compensation can help mitigate threshold voltage hysteresis (which improves first frame response), whereas the external compensation can help mitigate aging and other transistor reliability issues.

Row driver circuitry 18 may be located on the left and right edges of display 14, on only a single edge of display 14, or elsewhere in display 14. During operation, row driver circuitry 18 may provide row control signals on horizontal lines 28 (sometimes referred to as row lines, "scan" lines, and/or "emission" lines). Row driver circuitry 18 may include scan line driver circuitry for driving the scan lines and emission line driver circuitry for driving the emission lines. The scan line and emission line driver circuitry may sometimes be referred to as gate driver circuitry.

Demultiplexing circuitry 20 may be used to provide data signals D from display driver integrated circuit (DIC) 15 onto a plurality of corresponding vertical lines 26. Demultiplexing circuitry 20 may sometimes be referred to as column driver circuitry, data line driver circuitry, or source driver circuitry. Vertical lines 26 are sometimes referred to as data lines. During display operations, display data may be loaded into display pixels 22 using lines 26.

Each data line 26 is associated with a respective column of display pixels 22. Sets of horizontal signal lines 28 run horizontally across display 14. Each set of horizontal signal lines 28 is associated with a respective row of display pixels 22. The number of horizontal signal lines in each row is determined by the number of transistors in the display pixels 22 that are being controlled independently by the horizontal signal lines. Display pixels of different configurations may be operated by different numbers of scan lines.

Row driver circuitry 18 may assert control signals such as scan and emission signals on the row lines 28 in display 14.

For example, driver circuitry 18 may receive clock signals and other control signals from display driver integrated circuit 15 and may, in response to the received signals, assert scan control signals and an emission control signal in each row of display pixels 22. Rows of display pixels 22 may be processed in sequence, with processing for each frame of image data starting at the top of the array of display pixels and ending at the bottom of the array (as an example). While the scan lines in a row are being asserted, control signals and data signals that are provided to column driver circuitry 20 by DIC 15 may direct column driver circuitry 20 to demultiplex and drive associated data signals D (e.g., compensated data signals provided by data circuitry 13) onto data lines 26 so that the display pixels in the row will be programmed with the display data appearing on the data lines D. The display pixels can then display the loaded display data.

The external pixel compensation scheme described above may involve using sense circuitry 25 to perform current sensing on selected display pixels. In general, the amount of emission current flowing through each display pixel is dependent on the threshold voltage of a "drive" thin-film transistor (TFT) within that display pixel. The threshold voltage of the drive transistor may also vary depending on the current value of the gate-to-source voltage Vgs of the drive transistor. For example, the drive transistor threshold voltage may exhibit a first average level when Vgs is being raised from low to high, but may exhibit a second average level that is different than the first average level when Vgs is being lowered from high to low, thus yielding different current-voltage (I-V) characteristic curves. This dependence of the threshold voltage on the actual Vgs value is sometimes referred to as transistor "hysteresis," and if care is not taken, this hysteresis can negatively impact the accuracy of the current sensing operations performing by circuitry 25.

Figure 3:
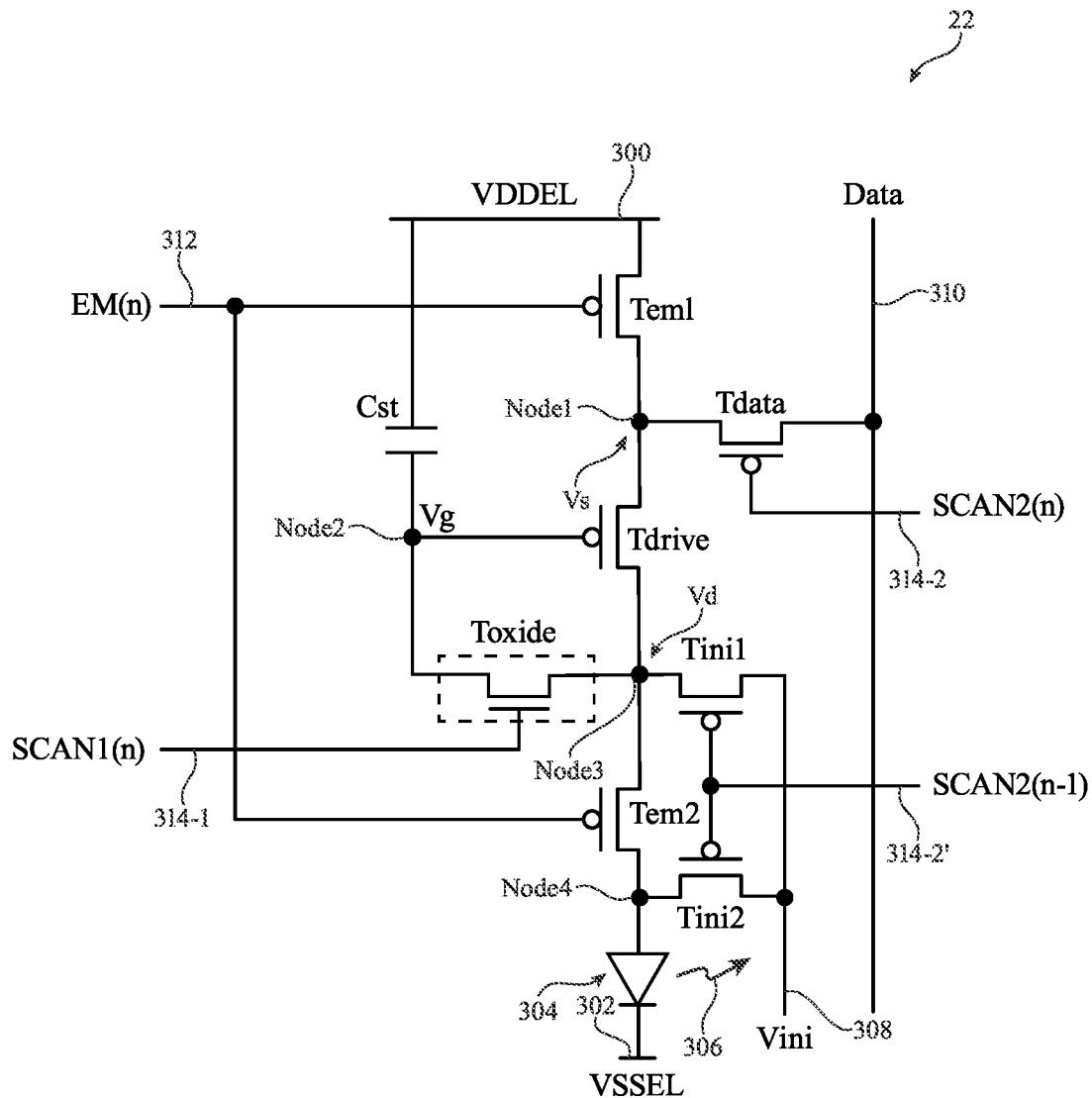
FIG. 3 is a circuit diagram of an illustrative display pixel configured to support in-pixel threshold voltage compensation and external threshold voltage compensation in accordance with an embodiment.

FIG. 3 is a circuit diagram of an illustrative organic light-emitting diode display pixel 22 in display 14 that is operable to support both in-pixel threshold voltage compensation and external threshold voltage compensation. As shown in FIG. 3, display pixel 22 may include a storage capacitor Cst, an n-type (i.e., n-channel) transistor such as semiconducting-oxide transistor Toxide, and p-type (i.e., p-channel) transistors such as a drive transistor Tdrive, a data loading transistor Tdata, a first emission transistor Tem1, second emission transistor Tem2, a first initialization transistor Tini1, and a second initialization transistor Tini2. While transistor Toxide is formed using semiconducting oxide (e.g., a transistor with a channel formed from semiconducting oxide such as indium gallium zinc oxide or IGZO), the other p-channel transistors may be thin-film transistors formed from a semiconductor such as silicon (e.g., polysilicon channel deposited using a low temperature process, sometimes referred to as LTPS or low-temperature polysilicon). Semiconducting-oxide transistors exhibit relatively lower leakage than silicon transistors, so implementing transistor Toxide as a semiconducting-oxide transistor will help reduce flicker (e.g., by preventing current from leaking away from the gate terminal of drive transistor Tdrive).

In another suitable arrangement, transistors Toxide and Tdrive may be implemented as semiconducting-oxide transistors while the remaining transistors Tdata, Tem1, Tem2, Tini1, and Tini2 are LTPS transistors. Transistor Tdrive serves as the drive transistor and has a threshold voltage that is critical to the emission current of pixel 22. Since the threshold voltage of transistor Tdrive may experience hysteresis, forming the drive transistor as a top-gate semiconducting-oxide transistor can help reduce the hysteresis (e.g., a top-gate IGZO transistor experiences less Vth hysteresis than a silicon transistor). If desired, any of the remaining transistors Tdata, Tem1, Tem2, Tini1, and Tini2 may be implemented as semiconducting-oxide transistors. Moreover, any one or more of the p-channel transistors may be n-type (i.e., n-channel) thin-film transistors.

Display pixel 22 may include an organic light-emitting diode (OLED) 304. A positive power supply voltage VDDEL may be supplied to positive power supply terminal 300, and a ground power supply voltage VSSEL may be supplied to ground power supply terminal 302. Positive power supply voltage VDDEL may be 3 V, 4 V, 5 V, 6 V, 7 V, 2 to 8 V, or any suitable positive power supply voltage level. Ground power supply voltage VSSEL may be 0 V, −1 V, −2 V, −3 V, −4 V, −5 V, −6V, −7 V, or any suitable ground or negative power supply voltage level. The state of drive transistor Tdrive controls the amount of current flowing from terminal 300 to terminal 302 through diode 304, and therefore the amount of emitted light 306 from display pixel 22. Organic light-emitting diode 304 may have an associated parasitic capacitance $C_{OLED}$ (not shown).

Terminal 308 may be used to supply an initialization voltage Vini (e.g., a negative voltage such as −1 V, −2 V, −3 V, −4V, −5 V, −6 V, or other suitable voltage) to assist in turning off diode 304 when diode 304 is not in use. Terminal 308 is therefore sometimes referred to as the initialization line. Control signals from display driver circuitry such as row driver circuitry 18 of FIG. 2 are supplied to control terminals such as row control terminals 312, 314-1, 314-2, and 314-2'. Row control terminal 312 may serve as an emission control terminal (sometimes referred to as an emission line or emission control line), whereas row control terminals 314-1 and 314-2 may serve as first and second scan control terminals (sometimes referred to as scan lines or scan control lines). Emission control signal EM may be supplied to terminal 312. Scan control signals Scan1 and Scan2 may be applied to scan terminals 314-1 and 314-2, respectively. Scan control signal Scan2 from a preceding row in the array of display pixels may be applied to scan terminal 314-2'. A data input terminal such as data signal terminal 310 is coupled to a respective data line 26 of FIG. 1 for receiving image data for display pixel 22. Data terminal 310 may also be referred to as the data line.

Control signals EM(n), Scan2(n), and Scan2(n−1) for modulating the p-type silicon transistors can be driven low to turn on those transistors (since p-type transistors are "active-low" devices) and driven high to turn them on. Control signals EM(n), Scan2(n), and Scan2(n−1), when asserted, may generally be driven to a voltage level that is lower than VSSEL (e.g., to overdrive the corresponding transistors). As an example, if VSSEL is equal to −3.5 V, signals EM(n), Scan2(n), and Scan2(n−1) might be driven to −9 V when asserted. Control signals EM(n), Scan2(n), and Scan2(n−1), when deasserted, may generally be driven to a voltage level that is higher than VDDEL (e.g., to further deactivate the corresponding transistors to help minimize leakage). As an example, if VDDEL is equal to 4.5 V, signals EM(n), Scan2(n), and Scan2(n−1) might be driven to 7 V when deasserted.

Control signal Scan1(n) for modulating the n-type semiconducting-oxide transistor Toxide can be driven high to turn on transistor Toxide (since n-type transistors are "active-high" devices) and driven low to turn off transistor Toxide. Since Scan1 independently controls transistor Toxide, the high and low levels of Scan1 can be adjusted to enhance oxide TFT driving capability. Control signal Scan1(n), when asserted, may generally be driven to a voltage level that is higher than VDDEL to overdrive transistor Toxide. As an example, if VDDEL is equal to 5 V, signal Scan1(n) might be driven to 12 V when asserted. Control signal Scan1(n), when deasserted, may generally be driven to a voltage level that is lower than VSSEL to minimize leakage through transistor Toxide. As an example, if VSSEL is equal to −2 V, signal Scan1(n) might be driven to −6 V when deasserted. The disclosed high and low voltage levels for each of these row control signals are merely illustrative and can be adjusted to other suitable voltage levels to support the desired mode of operation.

In the example of FIG. 3, transistors Tem1, Tdrive, Tem2, and OLED 304 may be coupled in series between power supply terminals 300 and 302. In particular, first emission control transistor Tem1 may have a source terminal that is coupled to positive power supply terminal 300, a gate terminal that receives emission control signal EM(n) via emission line 312, and a drain terminal (labeled as Node1). The notation "(n)" indicates that the corresponding signal is generated using a gate driver associated with that row of display pixels. The terms "source" and "drain" terminals of a transistor can sometimes be used interchangeably and may therefore sometimes be referred to as "source-drain" terminals.

Drive transistor Tdrive may have a source terminal coupled to Node1, a gate terminal (labeled as Node2), and a drain terminal (labeled as Node3). Second emission control transistor Tem2 may have a source terminal coupled to Node3, a gate terminal that also receives emission control signal EM(n) via emission line 312, and a drain terminal (labeled as Node4) coupled to ground power supply terminal 302 via light-emitting diode 304. Configured in this way, emission control signal EM(n) can be asserted (e.g., driven low or temporarily pulsed low) to turn on transistors Tem1 and Tem2 during an emission phase to allow current to flow through light-emitting diode 304.

Storage capacitor Cst may have a first terminal that is coupled to positive power supply line 300 and a second terminal that is coupled to Node2. Image data that is loaded into pixel 22 can be at least be partially stored on pixel 22 by using capacitor Cst to hold charge throughout the emission phase. Transistor Toxide may have a source terminal coupled to Node2, a gate terminal configured to receive scan control signal Scan1(n) via scan line 314-2, and a drain terminal coupled to Node3. Signal Scan1(n) may be asserted (e.g., driven high or temporarily pulsed high) to turn on n-type transistor Toxide to short the drain and gate terminals of transistor Tdrive. A transistor configuration where the gate and drain terminals are shorted is sometimes referred to as being "diode-connected."

Data loading transistor Tdata may have a source terminal coupled to data line 310, a gate terminal configured to receive scan control signal Scan2(n) via scan line 314-2, and a drain terminal coupled to Node1. Configured in this way, signal Scan2(n) can be asserted (e.g., driven low or temporarily pulsed low) to turn on transistor Tdata, which will allow a data voltage from data line 310 to be loaded onto Node1.

Transistor Tini1 may have a source terminal coupled to Node3, a gate terminal configured to receive scan control signal Scan2(n−1) via scan line 314-2', and a drain terminal coupled to initialization line 308. The notation "(n−1)" indicates that the corresponding signal is generated using a gate driver associated with a preceding row of display pixels (e.g., Scan2(n−1) represents the Scan2 signal that controls transistors Tdata in the immediately preceding row). Transistor Tini2 may have a source terminal coupled to Node4, a gate terminal configured to receive scan control signal Scan2(n−1) via scan line 314-2', and a drain terminal coupled to initialization line 308. Configured in this way, scan control signal Scan2(n−1) can be asserted (e.g., driven low or temporarily pulsed low) to turn on transistors Tini1 and Tini2, which drives both Node3 and Node4 down to initialization voltage Vini.

Figure 4:
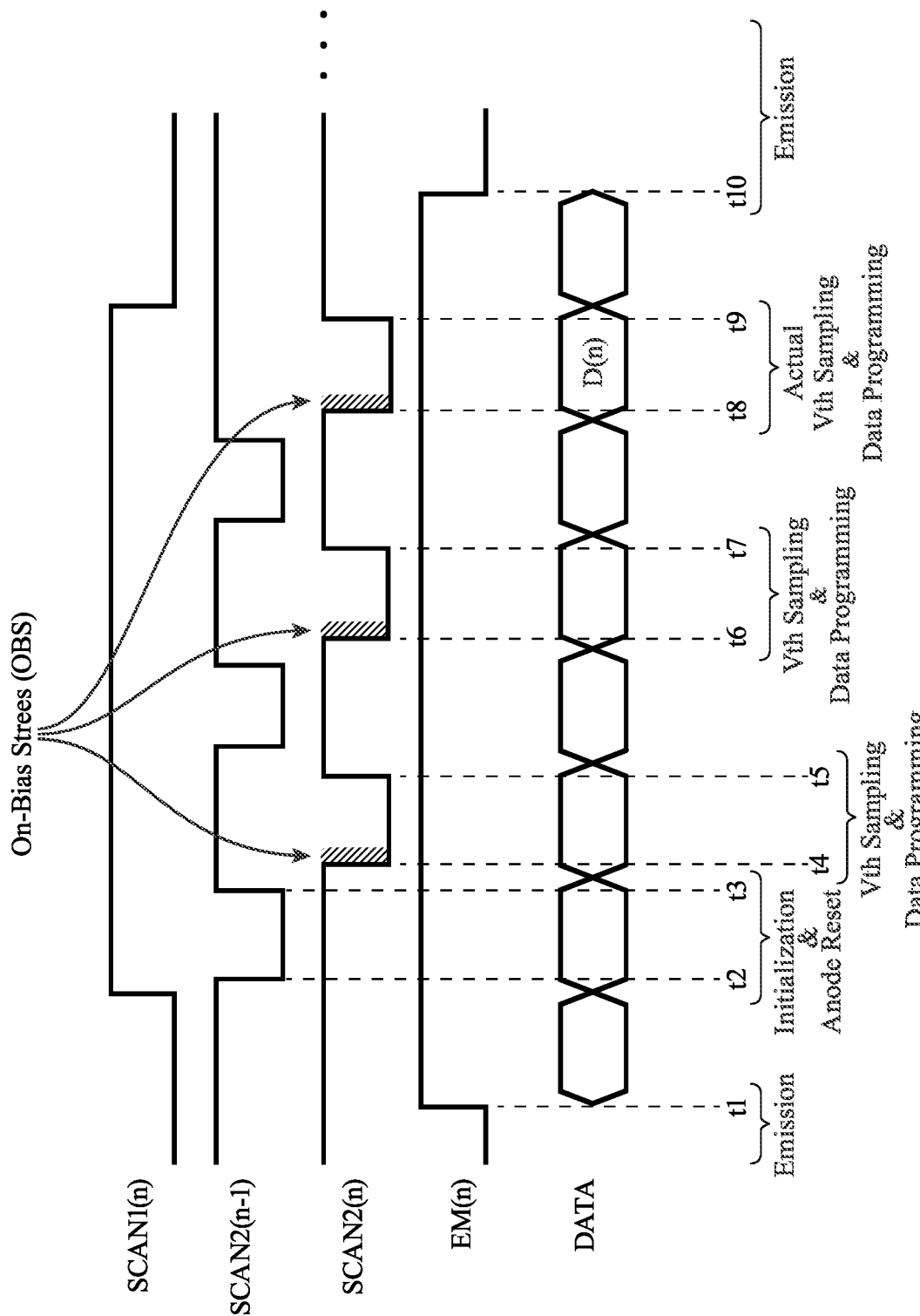
FIG. 4 is a timing diagram illustrating how multiple on-bias stress operations can be performed with threshold voltage sampling operations to help reduce hysteresis impact in accordance with an embodiment.

During normal data refresh period, display pixel 22 may be operated in at least four different types of phases: (1) an initialization/reset phase, (2) an on-bias stress phase, (3) a threshold voltage sampling and data writing phase, and (4) an emission phase—not necessarily in this order. FIG. 4 is a timing diagram showing relevant signal waveforms that may be applied to display pixel 22 during normal operation.

Prior to time t1, only signal EM(n) is asserted so pixel 22 is in the emission phase. At time t1, signal EM(n) is deasserted or driven low, which marks the end of the emission phase. At time t2 (at the beginning of the initialization phase), control signals Scan1(n) and Scan2(n−1) are asserted. Asserting signal Scan2(n−1) will turn on transistors Tini1 and Tini2 in parallel, which will drive Node3 and Node4 to Vini. Node3 is at the drain terminal of transistor Tdrive, so the corresponding voltage Vd at Node3 will be initialized to Vini during this time (i.e., Vd=Vini). Since Node4 is at the anode terminal of light-emitting diode 304, setting Node4 to Vini is sometimes referred to as performing "anode reset." Asserting signal Scan1(n) will turn on transistor Toxide, which shorts the gate and drain terminals of transistor Tdrive and therefore pulls the voltage at the gate terminal of the drive transistor Vg also down to Vini. During the initialization phase, the voltage across capacitor Cst is therefore reset to a predetermined voltage difference (VDDEL−Vini).

Signal Scan2(n−1) is deasserted at time t3 to turn off transistors Tini1 and Tini2, which marks the end of the initialization and anode reset phase. Signal Scan1(n) may remain asserted until the subsequent emission phase (e.g., transistor Toxide will remain on during the entirety of the initialization phase and the threshold voltage sampling and data writing phases).

At time t4, signal Scan2(n) is pulsed low to temporarily activate data loading transistor Tdata. Turning on transistor Tdata will load a data voltage Vdata onto the source terminal of the drive transistor such that the voltage Vs at Node1 is set to Vdata (i.e., Vs=Vdata). Since the drive transistor is currently in the diode-connected configuration (because Toxide is turned on), the drive transistor will pull gate voltage Vg up to (Vdata−Vth), where Vth represents the threshold voltage of the drive transistor. Thus, the voltage across capacitor Cst is now set to (VDDEL−Vdata+Vth). As such, drive transistor threshold voltage Vth has been successfully sampled and Vdata has been successfully programmed/written onto storage capacitor Cst.

The assertion of signal Scan2(n) at time t4 sets Vs to Vdata, which will then prompt the drive transistor to pull its gate voltage Vg from Vini up towards (Vdata−Vth). This brief period of time (see shaded portion in FIG. 4) while Vg is charging up to (Vdata−Vth) represents an on-bias stress phase. At the beginning of the on-bias stress phase (i.e., at time t4), the source-to-gate voltage of the drive transistor Vsg may be equal to (Vdata−Vini) so that Vdata is at least partially applied to the drive transistor prior to any threshold voltage sampling. Applying Vdata to pixel 22 prior to any threshold voltage sampling may be technically advantageous for the following reasons.

In certain situations, threshold voltage Vth can shift, such as when display 14 is transitioning from a black image to a white image or when transitioning from one gray level to another. This shifting in Vth (sometimes referred to herein as thin-film transistor "hysteresis") can cause a reduction in luminance, which is otherwise known as "first frame dimming." For example, the saturation current Ids waveform as a function of Vgs of the drive transistor for a black frame might be slightly offset from the target Ids waveform as a function of Vgs of the drive transistor for a white frame. Without performing on-bias stress, the sampled Vth will correspond to the black frame and will therefore deviate from the target Ids waveform by quite a large margin. By performing on-bias stress, the sampled Vth will correspond to Vdata and will therefore be much closer to the target Ids curve. Performing the on-bias stress phase to bias the Vsg of the drive transistor with Vdata before sampling Vth can therefore help mitigate hysteresis and improve first frame response. An on-bias stress phase may therefore be defined as an operation that applies a suitable bias voltage directly to the drive transistor during non-emission phases (e.g., such as by turning on the data loading transistor or the initialization transistor). Thus, although FIG. 4 shows Vth sampling and data writing phase as beginning at time t4, only the OBS phase begins at time t4, and the Vth sampling and data programming occurs immediately after the OBS phase (e.g., OBS will be followed automatically by the Vth sampling and data writing operation without having turning on any other transistors in pixel 22).

At time t5, signal Scan2(n) is deasserted, which marks the end of the Vth sampling the data programming phase. As shown in FIG. 4, the on-bias stress phase has a relatively short duration compared to the rest of the Vth sampling and data programming phase. To ensure the efficacy of the on-bias stress, signal Scan2(n) can be pulsed multiple times to perform additional on-bias stress operations. In the example of FIG. 4, signal Scan2(n) is pulsed low from time t6 to t7 to trigger a second on-bias stress phase and a second Vth sampling and data programming phase and is again pulsed low from time t8 to t9 to trigger a third on-bias stress phase and a third Vth sampling and data programming phase. The data loaded during the final data programming phase (see, e.g., data signal D(n)) represents the actual data value that will be displayed by this display pixel. The example of FIG. 4 in which three separate on-bias stress phases are performed is merely illustrative. If desired, less than three or more than three on-bias stress phases may be provided to help reduce the impact of Vth hysteresis.

At time t10, emission control signal EM(n) may again be asserted to signify the beginning of the emission phase. Asserting signal EM(n) will turn on transistors Tem1 and Tem2, which will pull Vs up to VDDEL. The resulting source-to-gate voltage Vsg of transistor Tdrive will be equal to VDDEL−(Vdata−Vth). Since the final emission current is proportional to Vsg minus Vth, the emission current will be independent of Vth since (Vsg−Vth) will be equal to (VDDEL−Vdata+Vth−Vth), where Vth cancels out. This type of operating scheme where the drive transistor threshold voltage is internally sampled and canceled out in this way is sometimes referred to as in-pixel threshold voltage compensation.

Figure 5:
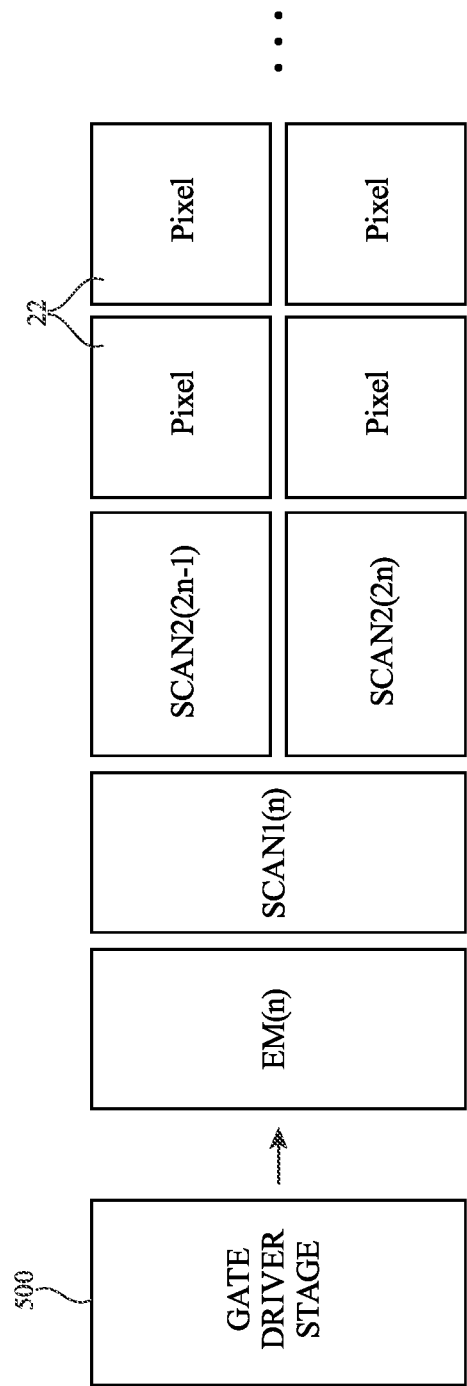
FIG. 5 is a diagram showing how at least some row control lines can be shared between pixels in adjacent rows in accordance with an embodiment.

In general, each of the row control signals is associated with only one of the rows in the array of display pixels. In certain embodiments, some of the row control lines can be shared between display pixels in adjacent rows (see, e.g., FIG. 5). As shown in FIG. 5, gate driver circuitry such gate driver stage 500 may drive row control signals EM and Scan1 that are shared between pixels in two neighboring rows and may also drive signal Scan2(2n−1) that is fed only to the first (odd) row of pixels 22 and signal Scan2(2n) that is fed only to second (even) row of pixels 22. Gate driver stage 500 may represent one stage in a chain of stages in row driver circuitry 18 (see FIG. 2). While signals Scan1 and EM can be shared among multiple adjacent rows, signal Scan2 cannot be shared since it controls the data loading (e.g., different pixels need to be loaded with different data signals to maintain full display resolution).

In the exemplary operation of FIG. 4, the duration for which signal Scan1 is high may be much shorter than the duration for which signal Scan1 is low (i.e., the emission phase is much longer than the non-emission phases). Signal Scan1 directly controls transistor Toxide within pixel 22. When signal Scan1 is low, transistor Toxide is turned off and is subject to negative bias temperature stress (NBTS). When signal Scan1 is high, transistor Toxide is turned on and is subject to positive bias temperature stress (PBTS). NBTS can cause oxide transistor threshold voltage Vth to shift in the negative direction over time, whereas PBTS can cause Vth to shift in the positive direction over time. When the emission phases are much longer than the non-emission phases, NBTS will dominate and may cause a negative drift in Vth over the lifetime of transistor Toxide, which also degrades the reliability of that transistor.

Figure 6:
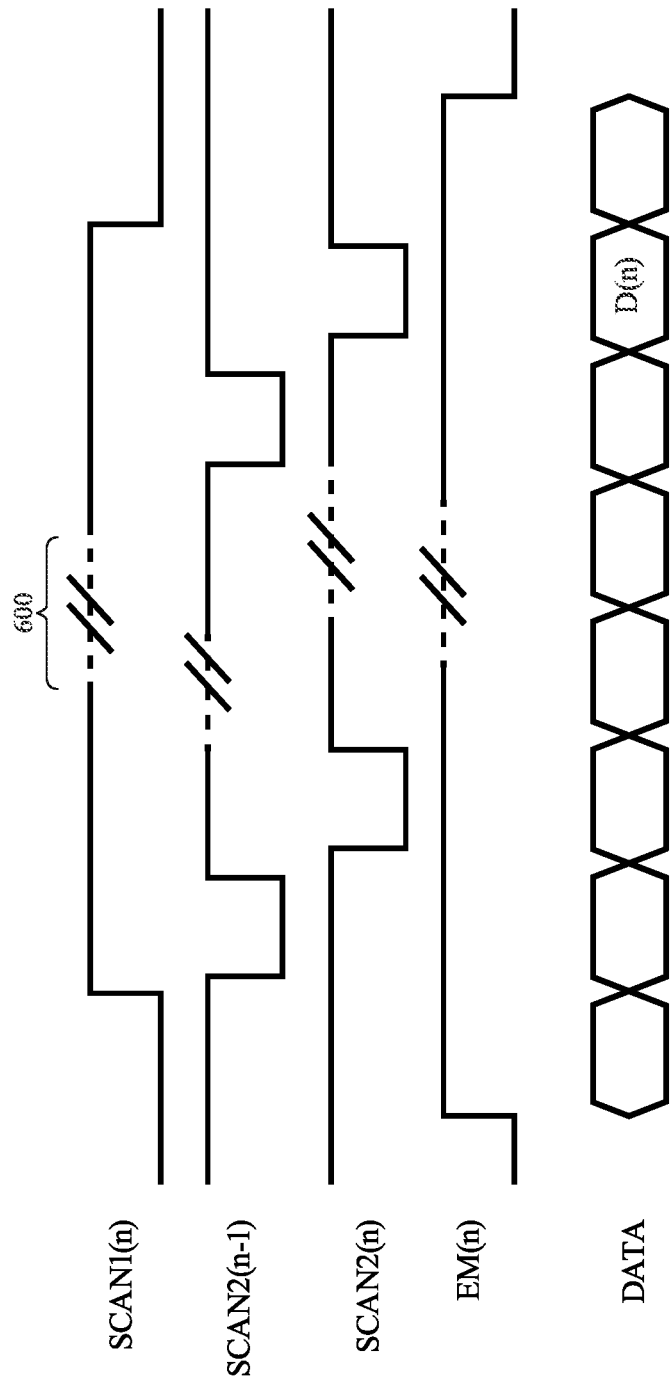
FIG. 6 is a diagram showing how the on-period for at least some row control signals can be extended to help balance negative bias temperature stress (NBTS) and positive bias temperature stress (PBTS) in accordance with an embodiment.

To help improve the reliability of the oxide transistor, the duration for which signal Scan1 is high may be adjusted, lengthened, or optimized to help balance the NBTS and PBTS (see, e.g., FIG. 6). In the timing diagram of FIG. 6, the period during which signal Scan1 is asserted may be extended as shown by dotted portion 600. When signal Scan1(n) is asserted, signals Scan2(n−1) and Scan2(n) may be pulses at least two times (as shown in FIG. 6), more than two times, three or more times, four to ten times, 10 or more times, 100 or more times, or any suitable number of times to perform the on-bias stress and Vth sampling and data programming operations. By tuning the on-period of the oxide transistor relative to its off-period, the risk of Vth shift can be minimized and the oxide TFT lifetime can be improved.

Figure 7:
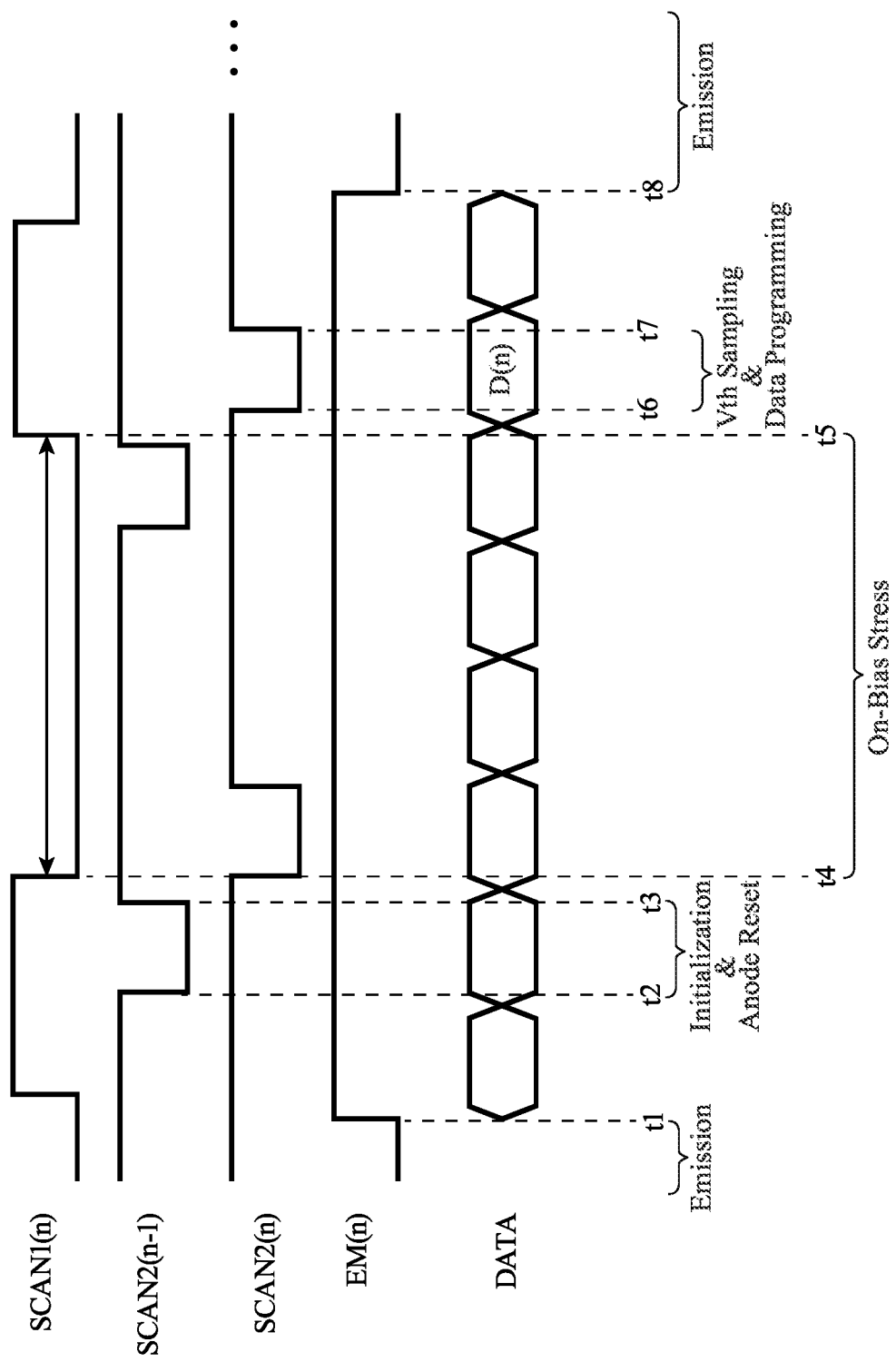
FIG. 7 is a timing diagram illustrating an on-bias stress operation that is optimized to mitigate first frame dimming in accordance with an embodiment.

FIG. 7 is a timing diagram illustrating how the on-bias stress phase can be further optimized to mitigate first frame dimming in accordance with another suitable arrangement. In contrast to the example of FIG. 4 in which signal Scan1 is constantly asserted during the non-emission period, FIG. 7 illustrates how signal Scan1 can be pulsed low during the non-emission period to provide an enhanced on-bias stress effect.

Prior to time t1, only signal EM(n) is asserted, so pixel 22 is in the emission phase. At time t1, signal EM(n) is deasserted or driven low, which marks the end of the emission phase. Signal Scan1(n) is asserted some time after t1, which turns on transistor Toxide. At time t2 (at the beginning of the initialization phase), control signal Scan2 (n−1) is asserted or pulsed low. Asserting signal Scan2(n−1) will turn on transistors Tini1 and Tini2 in parallel, which will drive Node3 and Node4 to Vini. Node3 is at the drain terminal of transistor Tdrive, so the corresponding voltage Vd at Node3 will be initialized to Vini during this time (i.e., Vd=Vini). The OLED anode terminal Node4 will also be reset to Vini. Since signal Scan1(n) is asserted, transistor Toxide will be on, which shorts the gate and drain terminals of transistor Tdrive and therefore pulls the voltage at the gate terminal of the drive transistor Vg also down to Vini. During the initialization and anode reset phase, the voltage across capacitor Cst is therefore reset to a predetermined voltage difference (VDDEL−Vini).

Signal Scan2(n−1) is deasserted at time t3 to turn off transistors Tini1 and Tini2, which marks the end of the initialization and anode reset phase. Signal Scan1(n) may remain asserted until the subsequent emission phase (e.g., transistor Toxide will remain on during the entirety of the initialization phase and the threshold voltage sampling and data writing phases).

At time t4, signal Scan1(n) is deasserted or pulsed low. Driving signal Scan1(n) low will turn off transistor Toxide so that the gate and drain terminals of the drive transistor Tdrive is no longer shorted (i.e., so that the drive transistor is no longer diode-connected). At time t4, control signal Scan2(n) is also pulsed low, which turns on data loading transistor Tdata and sets the source terminal voltage Vs to Vdata. Since the oxide transistor is turned off, gate terminal voltage Vg stays at initialization voltage Vini, which will cause the drain terminal voltage Vd to be pulled up to Vdata. Note that while transistor Toxide is turned off, no in-pixel Vth sampling can occur, so the entire duration from time t4 to t5 will serve as the on-bias stress phase. This period during which Scan1(n) is pulsed low from time t4 to t5 can be adjusted or optimized to improve first frame response of the display. Extending the on-bias stress phase in this way can also help obviate the need to perform multiple smaller on-bias stress operations as shown in the example of FIG. 4, which can reduce dynamic power consumption. At time t5, scan signal Scan1(n) is reasserted, which turns on transistor Toxide.

At time t6, control signal Scan2(n) is asserted or pulsed low, which sets Vs to Vdata. Since the drive transistor is currently in the diode-connected configuration (because Toxide is enabled), the drive transistor will pull gate voltage Vg up to (Vdata−Vth). Thus, the voltage across capacitor Cst is now set to (VDDEL−Vdata+Vth). As such, drive transistor threshold voltage Vth has been successfully sampled and Vdata has been successfully programmed/written onto storage capacitor Cst. At time t7, signal Scan2(n) is deasserted, which marks the end of the Vth sampling and data programming phase.

At time t8, emission control signal EM(n) may again be asserted to signify the beginning of the emission phase. Asserting signal EM(n) will turn on transistors Tem1 and Tem2, which will pull Vs up to VDDEL. The resulting source-to-gate voltage Vsg of drive transistor Tdrive will be equal to VDDEL−(Vdata−Vth). Since the final emission current is proportional to Vsg minus Vth, the emission current will be independent of Vth since (Vsg−Vth) will be equal to (VDDEL−Vdata+Vth−Vth), where Vth cancels out to achieve the in-pixel threshold voltage compensation.

In addition to performing the "in-pixel" threshold canceling described above in connection with FIG. 4 or FIG. 7, "external" threshold voltage compensation may also be performed using compensation circuitry 17 outside of each pixel 22. External variation compensation may, for example, be performed in the factory, when the display is idle or turned off, or in real time (e.g., during blanking intervals between successive image frames). While in-pixel threshold voltage compensation helps reduce hysteresis, external threshold voltage compensation can help mitigate transistor aging, drive transistor Vth shift over the lifetime of the display pixel, and other TFT reliability issues. An operating scheme where both in-pixel and external Vth compensation are achieved is sometimes referred to as a "hybrid" threshold voltage compensation driving scheme.

Figure 8A:
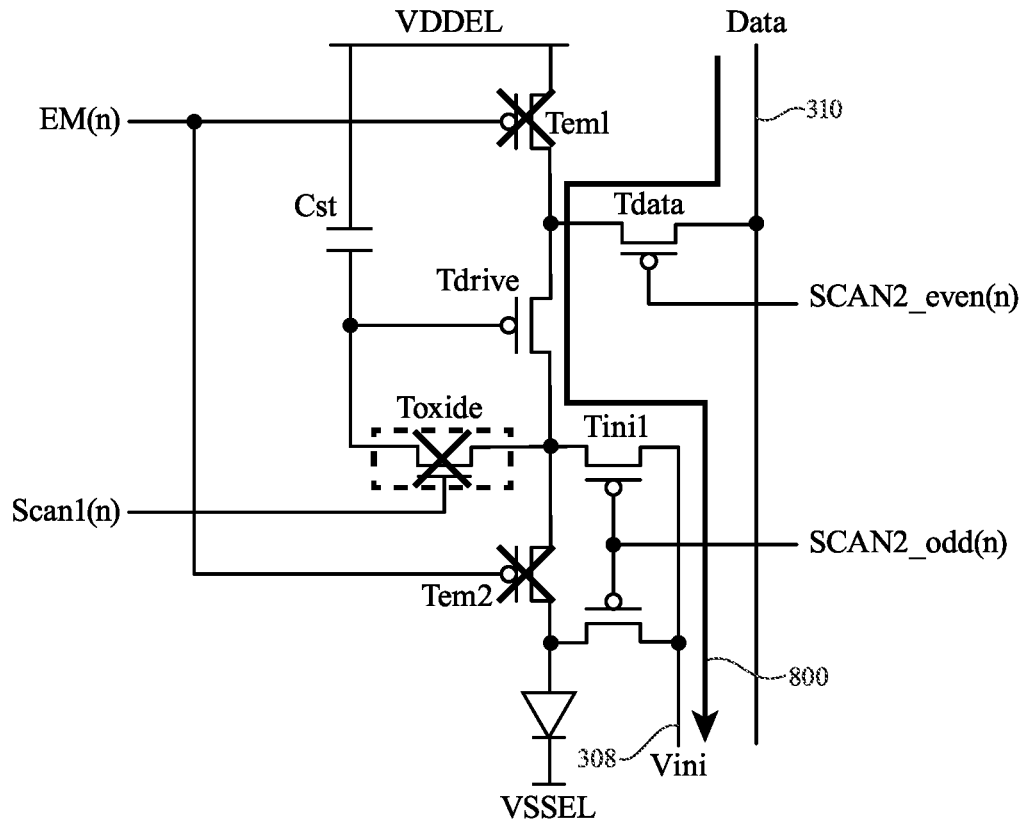
FIG. 8A is a diagram showing how a display pixel of the type shown in FIG. 3 can be configured to support external current sensing operations in accordance with an embodiment.
Figure 8B:
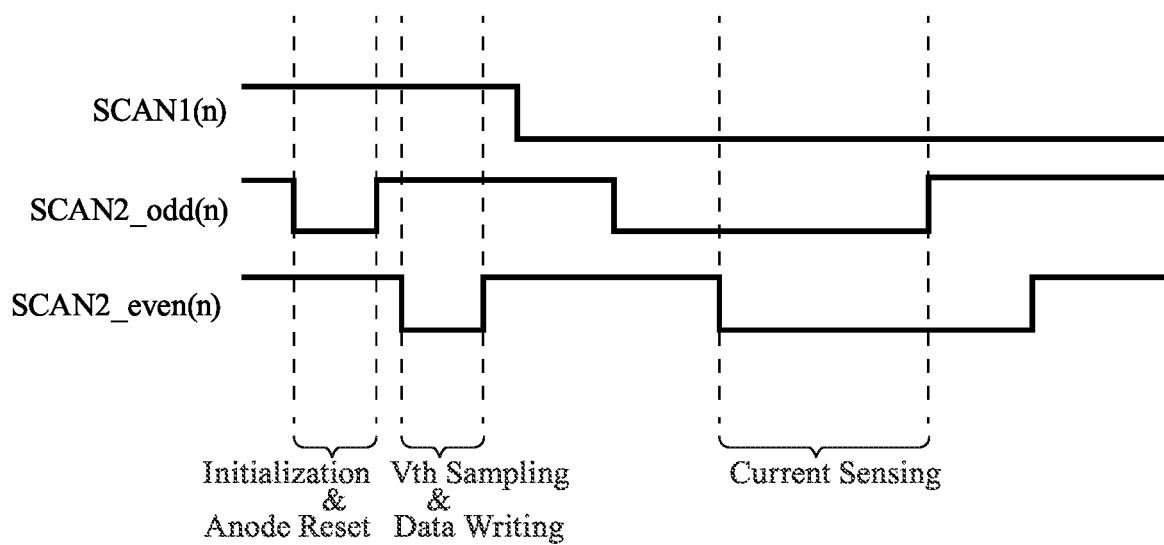
FIG. 8B is a timing diagram showing the behavior of relevant row control signals to perform an external current sensing operation in accordance with an embodiment.

FIG. 8A is a diagram showing how a display pixel of the type shown in FIG. 3 can be configured to support external current sensing operations. FIG. 8B is a timing diagram showing the behavior of relevant row control signals to perform such external current sensing operations. As shown in FIG. 8B, the odd row scan control signal Scan2_odd(n) can be pulsed low to perform the initialization and anode reset phase, and the even row scan control signal Scan2_even(n) can then be pulsed low to perform the Vth sampling and data programming phase. At some later time (e.g., when the display is turned off/idle or during some other time when the user is not viewing the display), both the even and odd Scan2 control signals are simultaneously asserted while Scan1 is deasserted to perform the current sensing operations.

Referring back to FIG. 8A, a low Scan1(n) turns off transistor Toxide, whereas a low Scan2_even(n) and a low Scan2_odd(n) will turn on transistors Tdata and Tini1. Emission control signal EM(n) should be deasserted during this time, which deactivates transistors Tem1 and Tem2. Configured in this way, a sensing current can flow from data line 310 through transistors Tdata, Tdrive, and Tini1 onto initialization line 308, as indicated by sensing current path 800. Current 800 can be measured using sense circuitry 25 (see FIG. 2) to generate compensation data that is stored in storage circuitry 29. As described above, external Vth compensation via current sensing in combination with in-pixel Vth canceling can help minimize any undesired TFT effects associated with the threshold voltage of the drive transistor, which helps maintain consistent luminance levels over the lifespan of the display.

Figure 9:
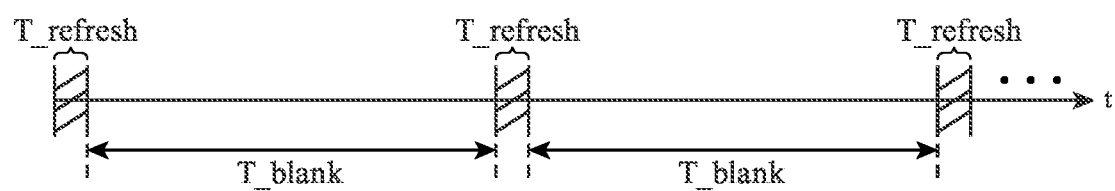
FIG. 9 is a diagram of a low refresh rate display driving scheme in accordance with an embodiment.

Display 14 may optionally be configured to support low refresh rate operation. Operating display 14 using a relatively low refresh rate (e.g., a refresh rate of 1 Hz, 2 Hz, 1-10 Hz, less than 30 Hz, less than 60 Hz, or other low rate) may be suitable for applications outputting content that is static or nearly static and/or for applications that require minimal power consumption. FIG. 9 is a diagram of a low refresh rate display driving scheme in accordance with an embodiment. As shown in FIG. 9, display 14 may alternate between a short data refresh period (as indicated by period T_refresh) and an extended vertical blanking period (as indicated by period T_blank). As an example, each data refresh period T_refresh may be approximately 16.67 milliseconds (ms) in accordance with a 60 Hz data refresh operation, whereas each vertical blanking period T_blank may be approximately 1 second so that the overall refresh rate of display 14 is lowered to 1 Hz. Configured as such, refresh duration T_blank can be adjusted to tune the overall refresh rate of display 14. For example, if the duration of T_blank was tuned to half a second, the overall refresh rate would be increased to approximately 2 Hz. In the embodiments described herein, T_blank may be at least two times, at least ten times, at least 30 times, or at least 60 times longer in duration than T_refresh (as examples).

Figure 10:
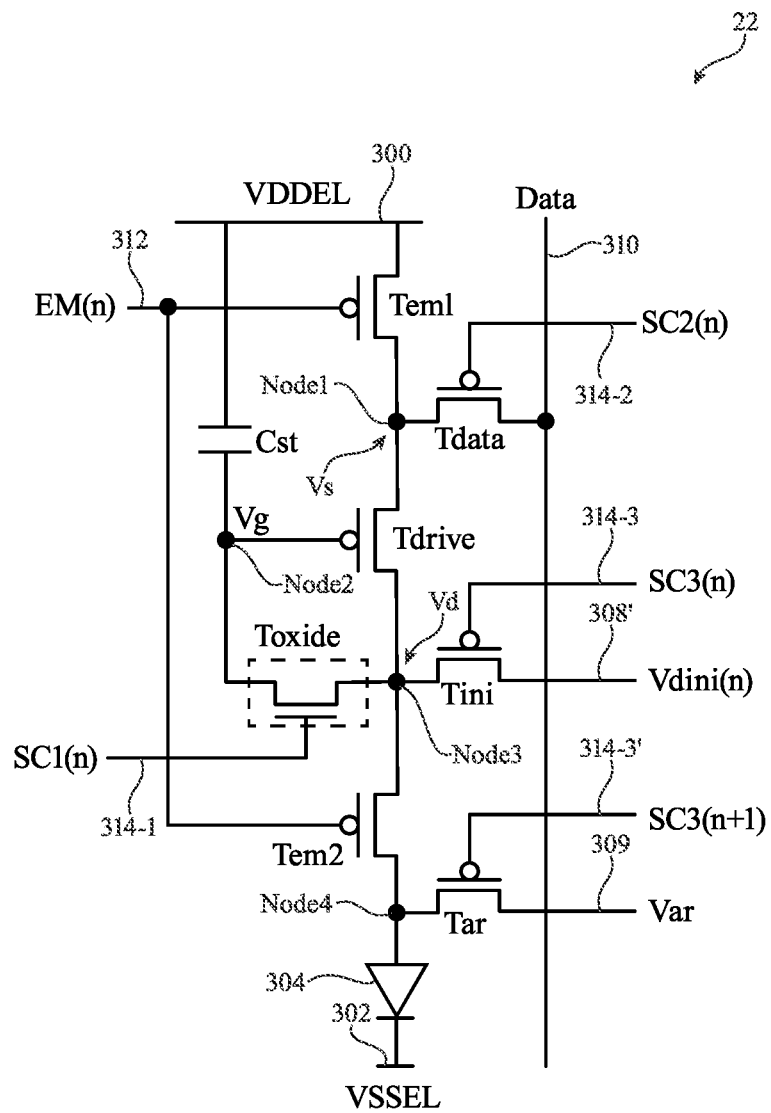
FIG. 10 is a circuit diagram of an illustrative display pixel configured to reduce flicker at low refresh rates in accordance with an embodiment.

A schematic diagram of an illustrative organic light-emitting diode display pixel 22 in display 14 that can be used to support low refresh rate operation is shown in FIG. 10. Pixel 22 of FIG. 10 may have similar structure as pixel 22 shown in FIG. 3 (i.e., pixel 22 in FIG. 10 has the same number of transistors and capacitor as pixel 22 in FIG. 3). Emission transistors Tem1 and Tem2 have gates configured to receive emission control signal EM(n) via emission line 312. Semiconducting-oxide transistor Toxide has a gate terminal configured to receive a first scan control signal SC1(n) via first scan line 314-1. Data loading transistor Tdata has a gate terminal configured to receive second scan control signal SC2(n) via second scan line 314-2.

In contrast to the pixel configuration of FIG. 3, the initialization line in display pixel 22 of FIG. 10 is only connected to one transistor within pixel 22. As shown in FIG. 10, an initialization transistor Tini has a source terminal coupled to Node3 (i.e., the drain terminal of the drive transistor), a gate terminal configured to receive a third scan control signal SC3(n) via third scan line 314-3, and a drain terminal coupled to a dynamic initialization line 308'. Display pixel 22 may further include an anode reset transistor Tar that has a source terminal coupled to Node4 (i.e., the anode terminal of OLED 304), a gate terminal configured to receive scan control signal SC3(n+1) generated from a subsequent row in the array, and a drain terminal coupled to an anode reset line 309. Dynamic initialization line 308' and anode reset line 309 may be separate control lines such that the initialization voltage Vdini(n) on line 308' and the anode reset voltage Var on line 309 can be biased to different levels during operation of pixel 22.

Figure 11:
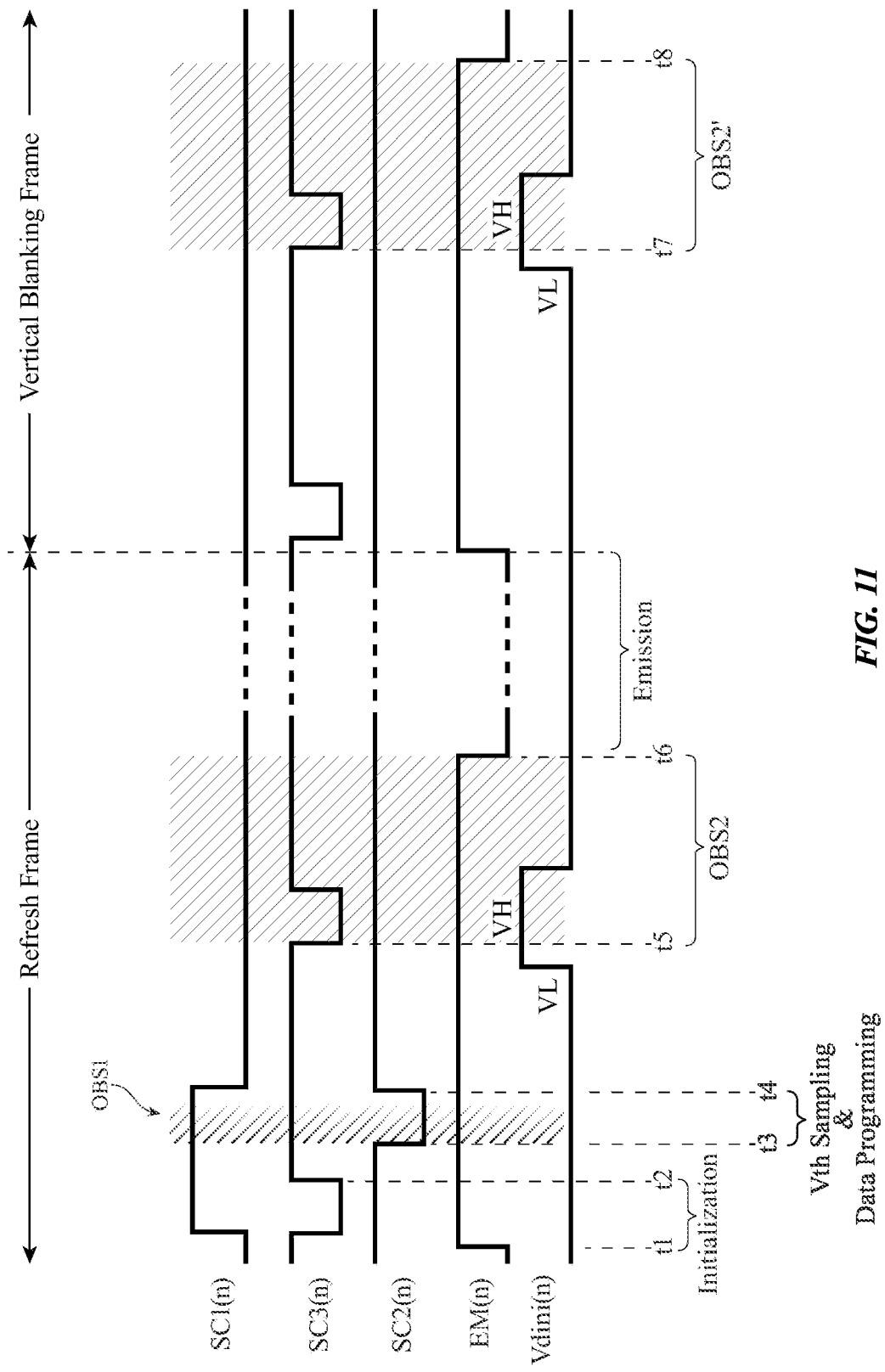
FIG. 11 is a timing diagram illustrating how an initialization voltage can be dynamically adjusted so that the dominant on-bias stress during the refresh phase and the on-bias stress during the vertical blanking phase are well-matched in accordance with an embodiment.

FIG. 11 is a timing diagram showing relevant signal waveforms that may be applied to display pixel 22 of FIG. 10 during both the refresh period (sometimes referred to as the "refresh frame") and the vertical blanking period (sometimes referred to as the "vertical blanking frame"). From time t1 to t2, scan control signals SC1(n) and SC3(n) are asserted to perform the initialization phase. During the initialization phase, the initialization line 308' is biased at low voltage VL, which will cause drain voltage Vd at Node3 will be pulled down to voltage VL. Since transistor Toxide is also on during this time, gate voltage Vg at Node2 will also be pulled down to VL. As a result, the voltage across capacitor Cst will be set to a predetermined voltage difference (VDDEL−VL).

At time t3, scan control signal SC2(n) will be pulsed low to perform the Vth sampling and data writing phase. As described above in connection with FIG. 3, the brief period of time following the assertion of signal SC2(n) where the drive transistor is temporarily activated to charge gate voltage Vg up to (Vdata−Vth) represents a first on-bias stress phase OBS1. By the end of time t4, the source voltage Vs at Node1 will be set to Vdata, whereas Vg and Vd will both be set to (Vdata−Vth) by virtue of the diode connection of the drive transistor. Thus, the voltage across storage capacitor Cst will be set of (VDDEL−Vdata+Vth).

In low refresh rate operation, the vertical blanking frame may be much longer than the refresh frame. To prevent Vth drift during the vertical blanking frame, it would be desirable to also implement one or more on-bias stress phases during the vertical blanking frame. During the vertical blanking frame, however, signals SC1(n) and SC2(n) cannot be asserted to turn on charge up Vs and Vd as a function of Vdata. Thus, another mechanism must be introduced to charge up Vs and Vd. In accordance with an embodiment, initialization voltage Vdini(n) may be dynamically raised from low voltage VL to a high voltage VH while asserting signal SC3(n) to perform a pseudo on-bias stress phase OBS2' during the vertical blanking frame. Voltage VH may be at least equal to or greater than Vdata, which will turn on drive transistor (whose gate is held at (Vdata−Vth) by capacitor Cst) and ensure that voltage Vs at Node1 is also charged to VH.

Initialization voltage Vdini may be dynamically adjusted on a per-row basis, so signal Vdini(n) is a row-based signal (e.g., signal Vdini may be asserted at different times for different rows). In contrast, the anode reset voltage Var may be a fixed direct current (DC) global voltage signal. The example of FIG. 11 in which one on-bias stress operation OBS2' is performed during the vertical blanking frame is merely illustrative. In general, two or more on-bias stress operations OBS2' may be performed during the vertical blanking frame. For example, on-bias stress operations OBS2' may be performed at a relatively high frequency of 30 Hz, 60 Hz, 120 Hz, 240 Hz, 10-240 Hz, or other suitable frequency.

By inspection, on-bias stress phase OBS2' from time t7 to t8 is qualitatively different than on-bias stress phase OSB1 from time t3 to t4 (i.e., the duration of the on-bias stress will be different, and the actual voltage applied to the source-drain terminals of the drive transistor will also be different). This mismatch in OBS1 versus OBS2' might create noticeable flicker.

To help reduce flicker, an additional on-bias stress phase OBS2 can be inserted between the Vth sampling and data programming phase and the emission phase (see, e.g., OBS2 inserted from time t5 to t6). As shown in FIG. 11, additional on-bias stress phase OBS2 in the refresh frame may be qualitatively identical to that of OBS2' in the vertical blanking frame. For example, signal SC3(n) may be pulsed low for the same duration, signal Vdini(n) may be dynamically biased to the same VH level, and the duration t5-t6 may be equal to the duration t7-t8). The longer on-bias stress phase OBS2 will dominate the prior/shorter on-bias stress phase OBS1, and reducing on-bias stress mismatch between the refresh and vertical blanking periods will provide improved display flicker performance.

In the example of FIG. 11, on-bias stress phase OBS2 is inserted immediately prior to the emission phase. In certain scenarios, it is possible for drive transistor threshold Vth to shift during the inserted phase OBS2. For instance, hysteresis and temperature variation could cause Vth to shift during OBS2, which can lead to undesirable Mura effects and degraded first frame response.

Figure 12:
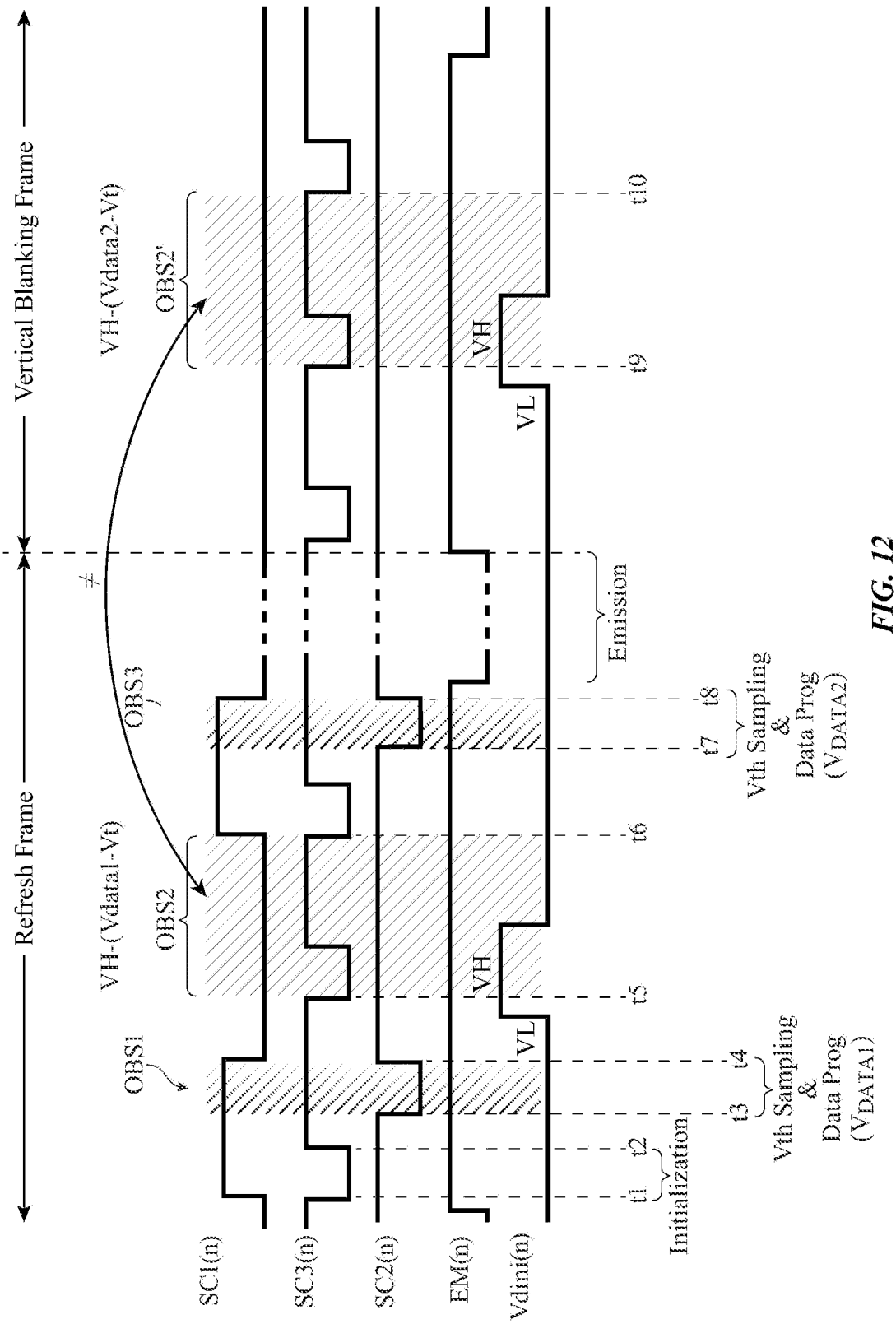
FIG. 12 is a timing diagram illustrating how a voltage sampling and data programming operation can be inserted after the dominant on-bias stress to improve first frame response in accordance with an embodiment.

To prevent first frame response degradation, Vth sampling should be performed after OBS2 and prior to the emission phase. FIG. 12 is a timing diagram illustrating how a voltage sampling and data programming operation can be inserted after the dominant on-bias stress phase OSB2 to improve first frame response in accordance with another embodiment. As shown in FIG. 12, a first Vth sampling and data programming phase may be performed from time t3-t4, dominant on-bias stress phase OBS2 may be performed from time t5-t6, and a second Vth sampling and data programming phase may be performed from time t7-78 after OBS2 and before the emission phase. As described above in connection with FIGS. 3 and 11, the brief period of time following the assertion of signal SC2(n) at time t7 where the drive transistor is temporarily activated to charge gate voltage Vg up to (Vdata-Vth) represents a momentary on-bias stress phase OBS3. By the end of time t8, the source voltage Vs at Node1 will be set to Vdata, whereas Vg and Vd will both be set to (Vdata-Vth) by virtue of the diode connection of the drive transistor.

Performing another Vth sampling and data programming operation after OBS2 can help accommodate for any potential Vth drift during OBS2, thereby improving first frame response. Although the short on-bias stress phases such as OBS1 and OBS3 do occur during the refresh frame, the longer on-bias stress phase OBS2 still dominates and if matched with OBS2' of the vertical planking frame, flicker can be minimized. Another potential issue that could arise to cause mismatch between OBS2 and OBS2' is that the data signal applied to pixel 22 during the different periods might be different. As shown in the example of FIG. 12, Vsg across the drive transistor during OBS2 could be (VH−(Vdata1−Vth)) while Vsg across the drive transistor during OBS2 might be (VH−(Vdata2−Vth)), where Vdata1 is not equal to Vdata2. If Vdata1≠Vdata2, the on-bias stress voltage between the refresh frame and the vertical blanking frame will be different, which could still result in noticeable flicker and/or a low-gray optical response.

Figure 13:
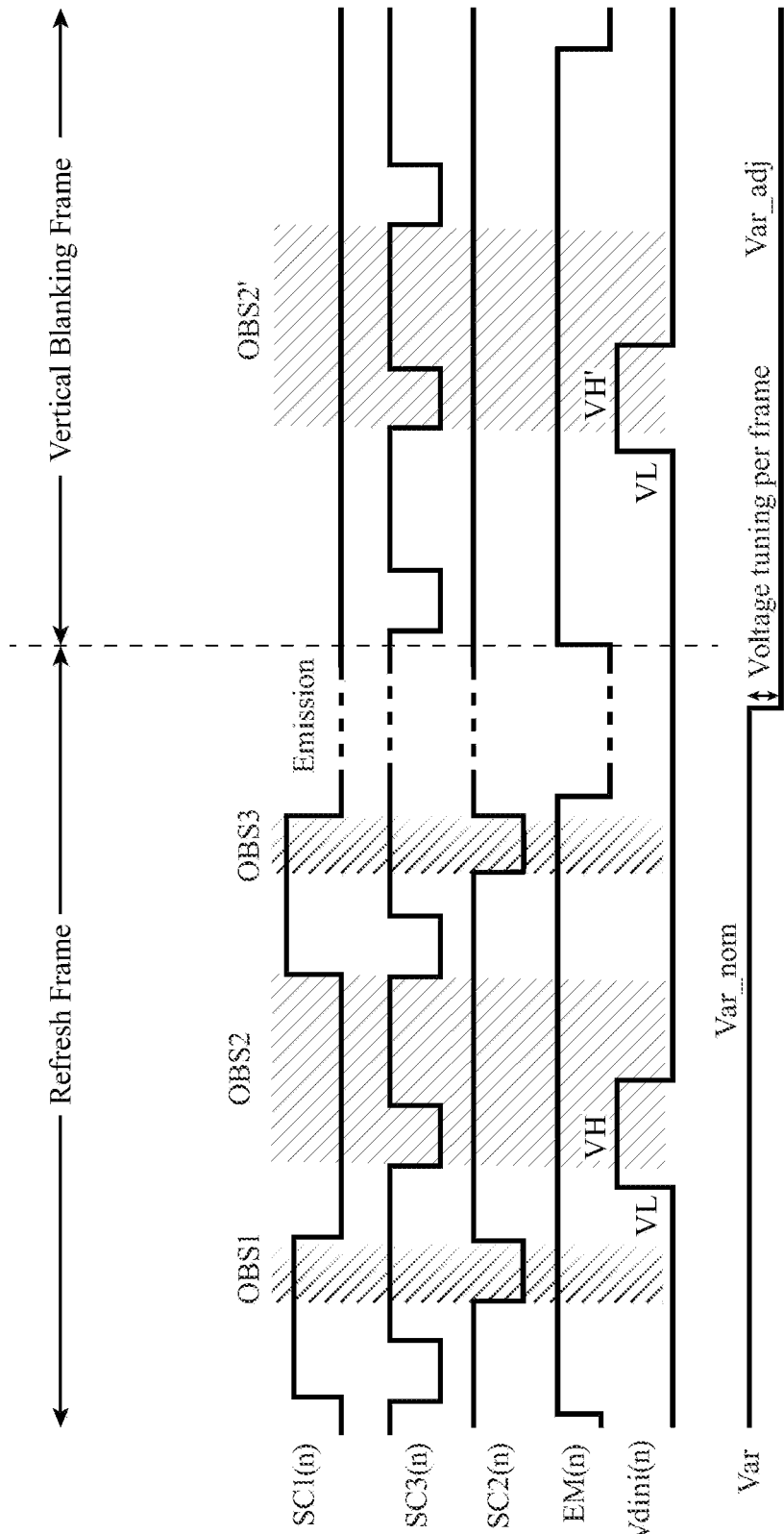
FIG. 13 is a timing diagram illustrating how an initialization voltage and/or an anode reset voltage can be dynamically adjusted to match the on-bias stress during the refresh phase and the vertical blanking phase in accordance with an embodiment.

To compensate for any potential mismatch in data signals between OBS2 and OBS2', the row-based initialization voltage Vdini(n) may be dynamically adjusted to slightly different voltage levels and/or the anode reset voltage Var may be dynamically tuned to slightly different voltage levels when transitioning between the refresh frame and the vertical blanking frame. FIG. 13 is a timing diagram illustrating how voltages Vdini(n) and/or Var can be dynamically adjusted to match the on-bias stress during the refresh and the vertical blanking periods. As shown in FIG. 13, initialization voltage Vdini(n) may be raised from VL to VH during OBS2 of the refresh frame but may be raised from VL to VH' during OBS2' of the vertical blanking frame. The difference in VH (i.e., VH'−VH) may be equal to (Vdata2−Vdata1) to help compensate for any mismatch in data signals, thereby eliminating any residual flicker and closing any undesired luminance gaps when toggling between refresh and vertical blanking frames.

If desired, anode reset voltage Var may also be tuned to help reduce any mismatch between the refresh and the vertical blanking periods. As shown in FIG. 13, anode reset voltage Var may be tuned from a nominal voltage level Var_nom during the refresh frame to an adjusted voltage level Var_adj during the vertical blanking frame. The difference in Var (i.e., Var_adj−Var_nom) may be any suitable voltage delta to help compensate for any operational mismatch within pixel 22, thereby eliminating any residual flicker and closing any undesired luminance gaps when toggling between refresh and vertical blanking frames. In contrast to initialization voltage Vdini(n), which is a row-based signal, anode reset voltage Var may be a sub-frame based signal (e.g., Var need not be adjusted on a per-row basis but can be adjusted when switching from the refresh frame to the vertical blanking frame). The sub-frame based tuning of anode reset voltage Var may be performed by itself (without raising the initialization voltage to VH') or in conjunction with raising the initialization voltage to VH' to minimize undesired display artifacts and optimize display performance.

Figure 14A:
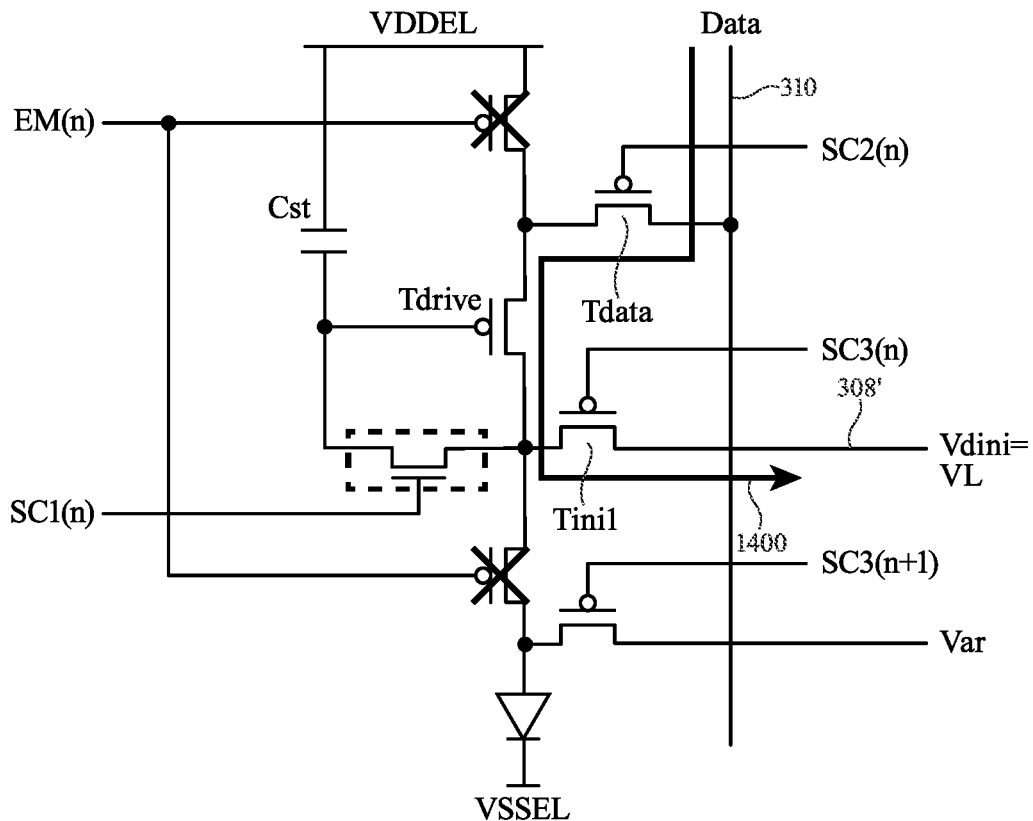
FIG. 14A is a diagram showing how a display pixel of the type shown in FIG. 10 can be configured to support external current sensing operations in accordance with an embodiment.
Figure 14B:
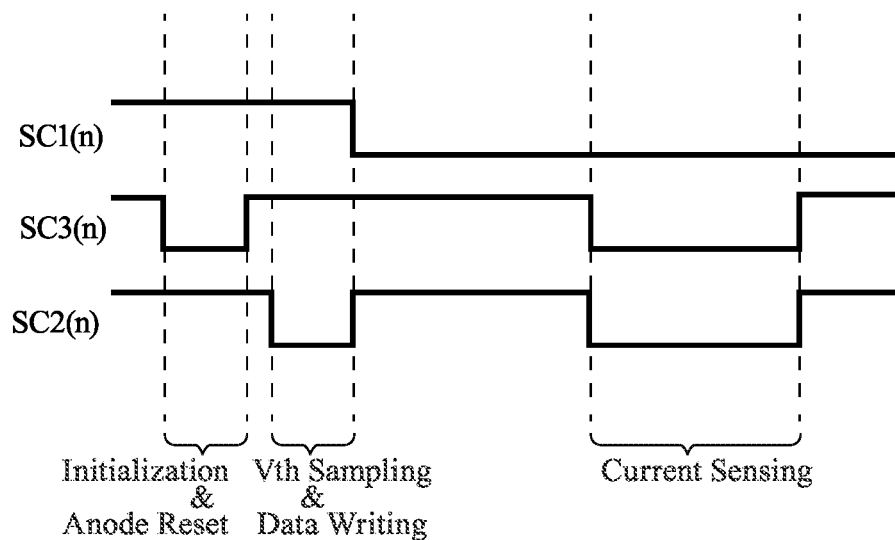
FIG. 14B is a timing diagram showing the behavior of relevant row control signals to perform an external current sensing operation in accordance with an embodiment.

FIG. 14A is a diagram showing how a display pixel of the type shown in FIG. 10 can be configured to support external current sensing operations. FIG. 14B is a timing diagram showing the behavior of relevant row control signals to perform such external current sensing operations. As shown in FIG. 14B, scan control SC3(n) can be pulsed low to perform the initialization phase, and scan control signal SC2(n) can then be pulsed low to perform the Vth sampling and data programming phase. At some later time (e.g., when the display is turned off/idle or during some other time when the user is not viewing the display), both control signals SC3(n) and SC2(n) are simultaneously asserted while SC1(n) is deasserted to perform the current sensing operations.

Referring back to FIG. 14A, a low SC1(n) during the current sensing phase turns off transistor Toxide, whereas a low SC3(n) and a low SC2(n) will turn on transistors Tdata and Tini, respectively. Emission control signal EM(n) should be deasserted during this time, which deactivates transistors Tem1 and Tem2. Configured in this way, a sensing current can flow from data line 310 through transistors Tdata, Tdrive, and Tini onto initialization line 308', as indicated by sensing current path 1400. The initialization voltage Vdini(n) should be set to the low voltage VL during current sensing operations. Current 1400 can be measured using sense circuitry 25 (see FIG. 2) to generate compensation data that is stored in storage circuitry 29. As described above, external Vth compensation via current sensing in combination with in-pixel Vth canceling can help minimize any undesired TFT effects associated with the threshold voltage of the drive transistor, which helps maintain consistent luminance levels over the lifespan of the display.

Figure 15:
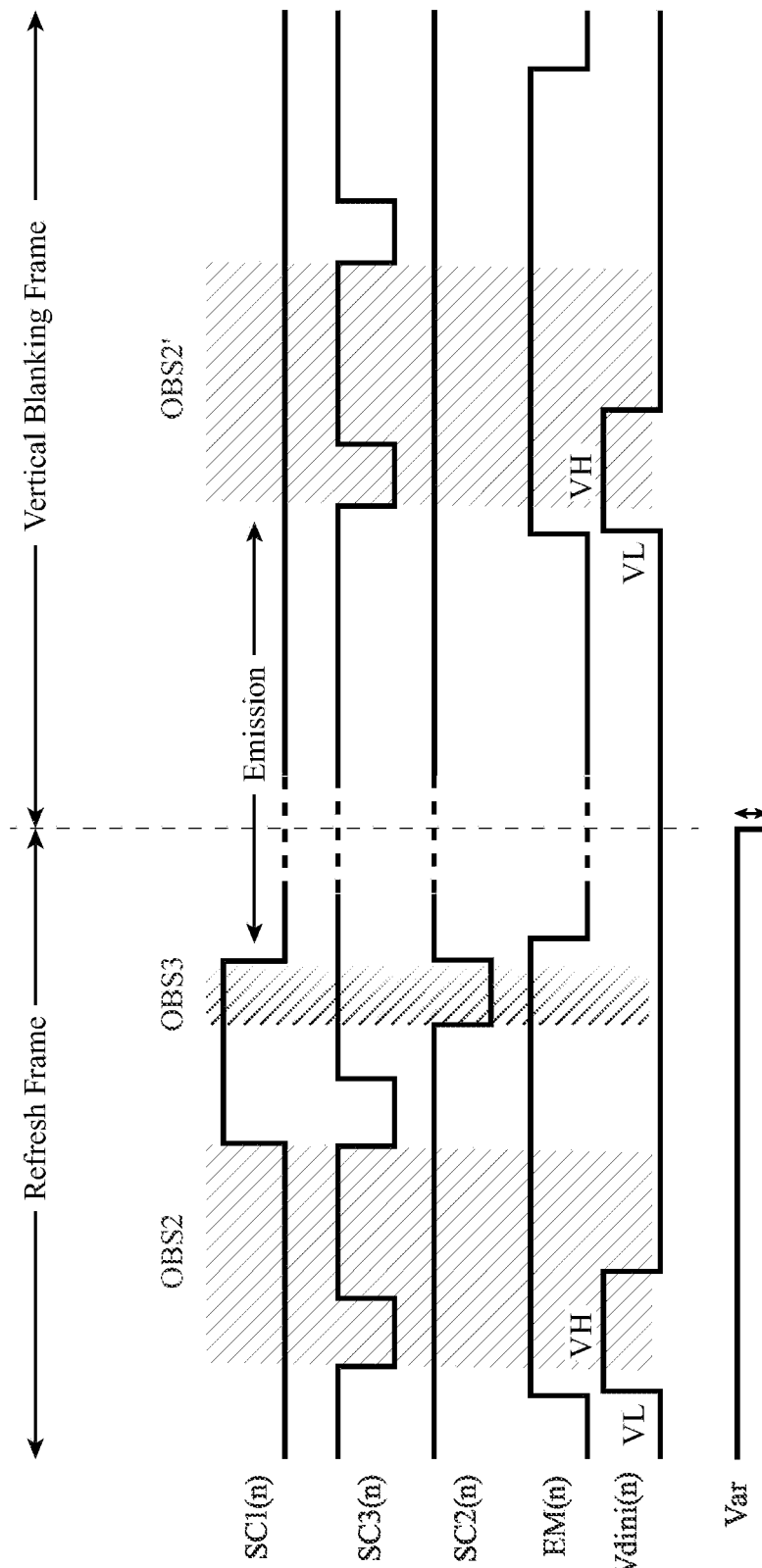
FIGS. 15 and 16 are timing diagrams illustrating other ways of performing on-bias stress during the refresh and vertical blanking phases while dynamically adjusting the initialization and/or anode reset voltage in accordance with certain embodiments.

The example of FIG. 13 in which three separate on-bias stress phases (e.g., OBS1, OB2, and OBS3) are performed prior to the emission phase is merely illustrative. FIG. 15 illustrates another suitable operational method where OBS1 is removed. As shown in FIG. 15, only two separate on-bias stress phases (e.g., OBS2 and OBS3) are performed prior to the emission phase. Thus, scan control signal SC2(n) need to be pulsed only once during each refresh frame (i.e., during OBS3). Note that by removing OBS1, the leading pulse in SC3(n) can also be removed (comparing FIG. 13 to FIG. 15), which allows OBS2 to be performed immediately following the emission phase. Operating the display in this way obviates the need to perform OBS2, which can help save power and improve performance. The remainder of the display operation is similar to that of FIG. 13 and need not be described again in detail. If desired, voltages Vdini(n) and Var may be dynamically adjusted to help compensate for any mismatch in data signals, thereby eliminating any residual flicker and closing any undesired luminance gaps when toggling between refresh and vertical blanking frames.

Figure 16:
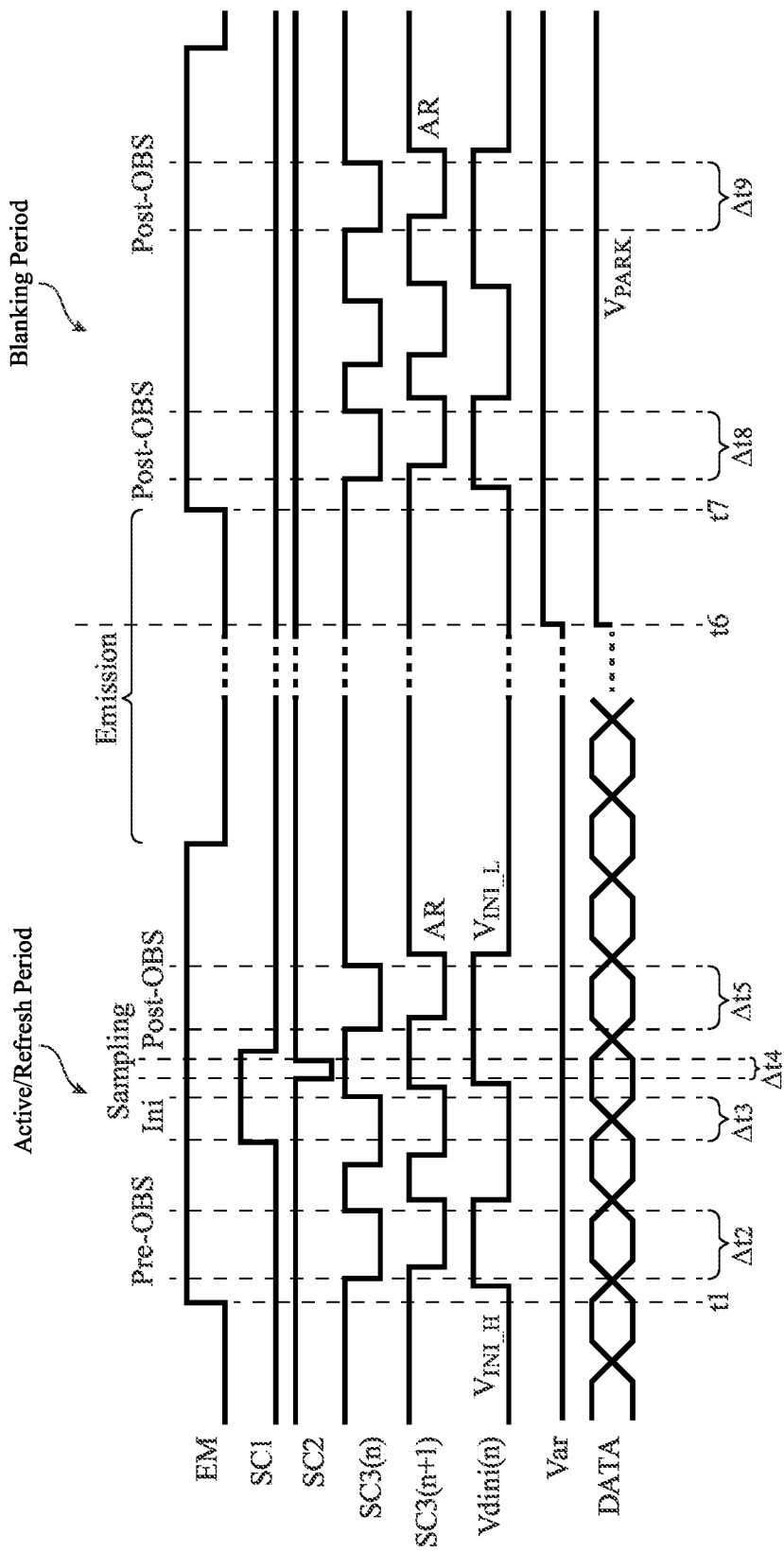

FIG. 16 is a timing diagram showing another suitable way for operating display pixel circuit 22 of the type shown in FIG. 10. As shown in FIG. 16, the operations prior to time t6 are performed during the active/refresh period, whereas the operations after time t6 are performed during the blanking period. At time t1, the emission signal EM may be deasserted (e.g., driven high) to begin the active data refresh period. During period Δt2, a pre on-bias stress phase (pre-OBS) may be performed by selectively pulsing signals SC3(n) and SC3(n+1) and dynamically adjusting Vdini(n) from a low voltage level $V_{INI\_L}$ to a high voltage level $V_{INI\_H}$. Asserting signal SC3(n) will turn on transistor Tini to apply $V_{INI\_H}$ to the drain terminal of the drive transistor, whereas asserting signal SC3(n+3) will turn on transistor Tar to perform anode reset for the OLED.

During period Δt3, an initialization phase may be carried out by pulsing signal SC1 high while pulsing signals SC3(n) and SC3(n+1) low. Voltage Vdini is back at the $V_{INI\_L}$ level. Driving signal SC1 high will turn on n-channel semiconducting-oxide transistor Toxide. Driving signal SC3(n) low will turn on transistor Tini to apply $V_{INI\_L}$ to the drain terminal of the drive transistor, whereas driving signal SC3(n+3) high will turn on transistor Tar to again perform anode reset on the OLED.

During period Δt4, a data programming/sampling phase may be performed by pulsing signal SC2 low while signal SC1 is still high and while signals SC3(n) and SC3(n+1) remain deasserted. Driving signal SC2 low will turn on transistor Tdata to load the desired data signal onto the source terminal of the drive transistor while transistor Toxide is kept on to allow sampling of the threshold voltage Vth of the drive transistor.

During period Δt5, a post on-bias stress phase (post-OBS) may be performed by selectively pulsing signals SC3(n) and SC3(n+1) while Vdini(n) is adjusted to $V_{INI\_H}$. Asserting signal SC3(n) will turn on transistor Tini to again apply $V_{INI\_H}$ to the drain terminal of the drive transistor, whereas asserting signal SC3(n+3) will turn on transistor Tar to again perform anode reset at the OLED.

If desired, anode reset voltage Var may be adjusted at time t6 to help reduce any mismatch between the active and blanking periods. The voltage change in Var at time t6 may be any suitable voltage delta to help compensate for any operational mismatch within pixel 22, thereby eliminating any residual flicker and closing any undesired luminance gaps when toggling between refresh and vertical blanking frames. At time t7, the emission signal EM may be deasserted (e.g., driven high) to begin the blanking period. During the blanking period, the data signals on the data line may be parked at some predetermined voltage level Vpark to help reduce dynamic power consumption. If desired, $V_{INI\_H}$ and Var can be different between the active and blanking periods. If desired, $V_{INI\_H}$, Var, and Vpark may also be different between different blanking periods.

Note that the pre-OBS phase during Δt2 and the post-OBS phase during Δt5 in the active frame will add a first additional post-OBS phase during Δt8 and a second additional post-OBS phase during Δt9 in the blanking frame. During the blanking period, the pulsing of signal SC3(n+1) will also serve to carry out at least three corresponding anode resets using the adjusted Var voltage. The driving scheme illustrated in connection with FIG. 16 may (as an example) be implemented using four gate drivers on each side of the pixel array, where the SC2, EM, Vdini, and SC3(n+1) signal drivers are formed on a first side of the array and where the SC1, SC2, SC3, Vdini signal drivers are formed on a second side of the array, which is equivalent to five total gate drivers.

Figure 17A:
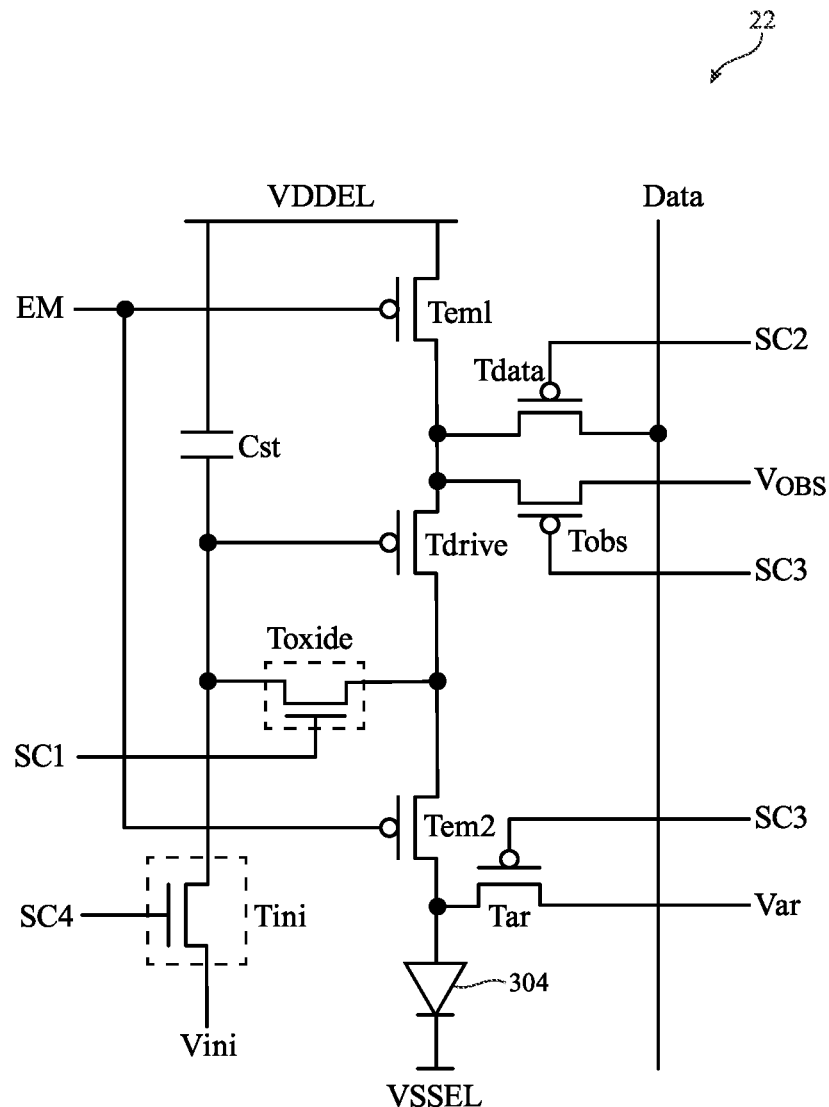
FIG. 17A is a circuit diagram of another suitable implementation of an illustrative display pixel circuit in accordance with an embodiment.

FIG. 17A illustrates another suitable implementation of display pixel 22. The pixel structure of FIG. 17A is similar to the pixel structure of FIG. 10, except the initialization transistor Tini is now coupled to the gate of the drive transistor and an additional dedicated on-bias stress transistor Tobs is connected to the source terminal of the drive transistor. In particular, transistor Tini may be implemented as an n-channel semiconducting-oxide transistor with a first source-drain terminal connected to the gate terminal of the drive transistor, a gate terminal configured to receive a fourth scan control signal SC4, and a second source-drain terminal connected to an initialization line on which initialization voltage Vini is provided. Transistor Tobs may be implemented as a p-channel silicon transistor with a first source-drain terminal connected to the source terminal of the drive transistor, a gate terminal configured to receive the third scan control signal SC3 (shared with transistor Tar), and a second source-drain terminal connected to an on-bias stress line on which on-bias stress voltage Vobs is provided. The on-bias stress voltage Vobs may be set to some predetermined or suitable voltage level that can be applied to the drive transistor such that the sampled Vth will correspond as close to the desired Vdata as possible.

The example of FIG. 17A in which transistors Toxide and Tini are implemented using n-type semiconducting-oxide transistors while the remaining transistors are implemented using p-type silicon transistors is merely illustrative. If desired, transistors Toxide and Tini may alternatively be implemented as p-type semiconducting-oxide transistors; any one or more of the other transistors Tem1, Tem2, Tdrive, Tdata, Tar, and/or Tobs may be implemented as n-type or p-type semiconducting-oxide transistors or n-type silicon transistors; pixel 22 may include more than eight or less than eight transistors; pixel 22 may include more than one capacitor, etc.

Figure 17B:
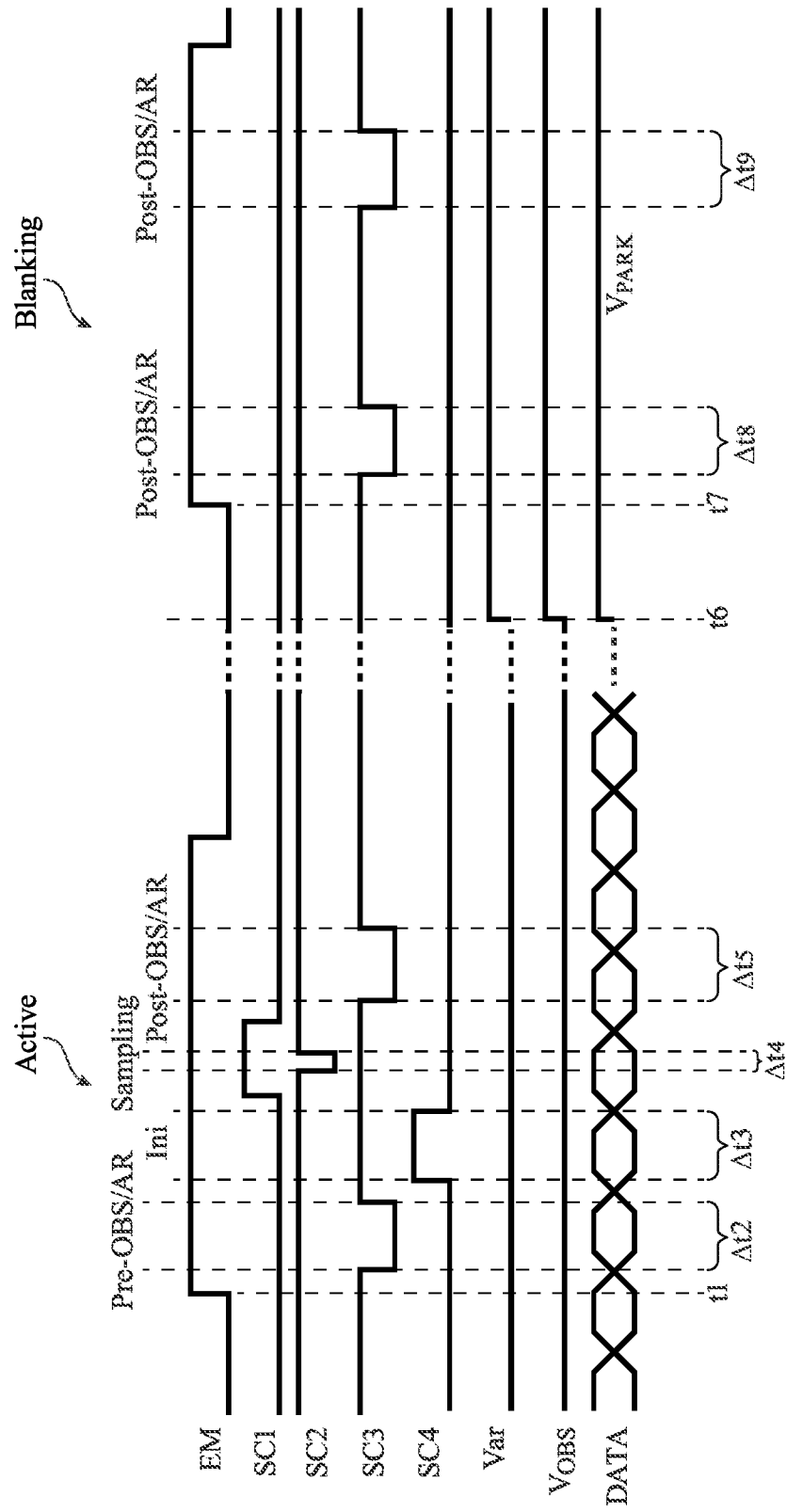
FIG. 17B is a timing diagram illustrating relevant waveforms for operating the pixel circuit shown in FIG. 17A in accordance with an embodiment.

FIG. 17B is a timing diagram illustrating the operation of pixel 22 shown in FIG. 17A. As shown in FIG. 17A, the operations prior to time t6 are performed during the active/refresh period, whereas the operations after time t6 are performed during the blanking period. At time t1, the emission signal EM may be deasserted (e.g., driven high) to begin the active data refresh period. During period Δt2, a pre on-bias stress phase (pre-OBS) may be performed by selectively pulsing signal SC3(n). Asserting signal SC3(n) will turn on transistor Tobs to apply Vobs to the source terminal of the drive transistor and will also turn on transistor Tar to perform anode reset for the OLED.

During period Δt3, an initialization phase may be carried out by pulsing signal SC4 high while the other signals are deasserted. Driving signal SC4 high will turn on n-channel semiconducting-oxide transistor Tini to apply initialization voltage Vini to the gate terminal of the drive transistor. Signal SC3 is high at this time, so no anode reset will be performed during Δt3.

During period Δt4, a data programming/sampling phase may be performed by pulsing signal SC2 low while signal SC1 is still high and while signals SC3(n) and SC4 are deasserted. Driving signal SC2 low will turn on transistor Tdata to load the desired data signal onto the source terminal of the drive transistor while transistor Toxide is kept on to allow sampling of the threshold voltage Vth of the drive transistor.

During period Δt5, a post on-bias stress phase (post-OBS) may be performed by selectively pulsing signal SC3(n). Asserting signal SC3(n) will again turn on transistor Tobs to apply Vobs to the source terminal of the drive transistor and will also turn on transistor Tar to perform anode reset at the OLED.

If desired, anode reset voltage Var and the on-bias stress voltage Vobs may be adjusted at time t6 to help reduce any mismatch between the active and blanking periods. The voltage change in Var and Vobs at time t6 may be any suitable voltage delta to help compensate for any operational mismatch within pixel 22, thereby eliminating any residual flicker and closing any undesired luminance gaps when toggling between refresh and vertical blanking frames. At time t7, the emission signal EM may be deasserted (e.g., driven high) to begin the blanking period. During the blanking period, the data signals on the data line may be parked at some predetermined voltage level Vpark to help reduce dynamic power consumption. If desired, Vobs and Var can be different between the active and blanking periods. If desired, Vobs, Var, and Vpark may also be different between different blanking periods.

Note that the pre-OBS/anode reset (AR) phase during Δt2 and the post-OBS/anode reset phase during Δt5 in the active frame will add a first additional post-OBS/AR phase during Δt8 and a second additional post-OBS/AR phase during Δt9 in the blanking frame. During the blanking period, the pulsing of signal SC3 will serve to carry out at least two corresponding anode resets using the adjusted Var voltage. The driving scheme illustrated in connection with FIG. 17A/B may (as an example) be implemented using three gate drivers on each side of the pixel array, where the SC1, SC2, and EM signal drivers are formed on a first side of the array and where the SC2, SC3, an SC4 signal drivers are formed on a second side of the array, which is equivalent to five total gate drivers.

Figure 18A:
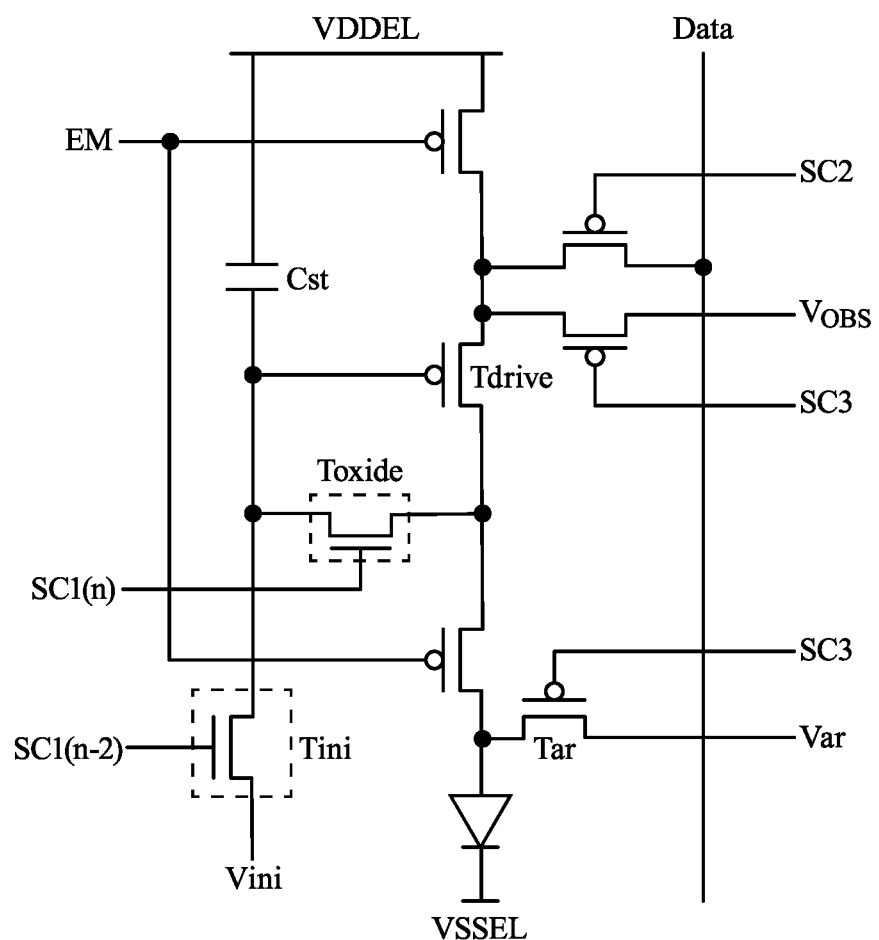
FIG. 18A is a circuit diagram of yet another suitable implementation of an illustrative display pixel circuit in accordance with an embodiment.

FIG. 18A illustrates another suitable implementation of display pixel 22. The pixel structure of FIG. 18A is similar to the pixel structure of FIG. 17A, except the initialization transistor Tini is now controlled by SC1(n−2), which is the SC1 signal from two rows above. Similar to the example of FIG. 17A, transistor Tini of FIG. 18A may be implemented as an n-channel semiconducting-oxide transistor. The example of FIG. 18A in which transistors Toxide and Tini are implemented using n-type semiconducting-oxide transistors while the remaining transistors are implemented using p-type silicon transistors is merely illustrative. If desired, transistors Toxide and Tini may alternatively be implemented as p-type semiconducting-oxide transistors; any one or more of the other transistors Tem1, Tem2, Tdrive, Tdata, Tar, and/or Tobs may be implemented as n-type or p-type semiconducting-oxide transistors or n-type silicon transistors; pixel 22 may include more than eight or less than eight transistors; pixel 22 may include more than one capacitor, etc.

Figure 18B:
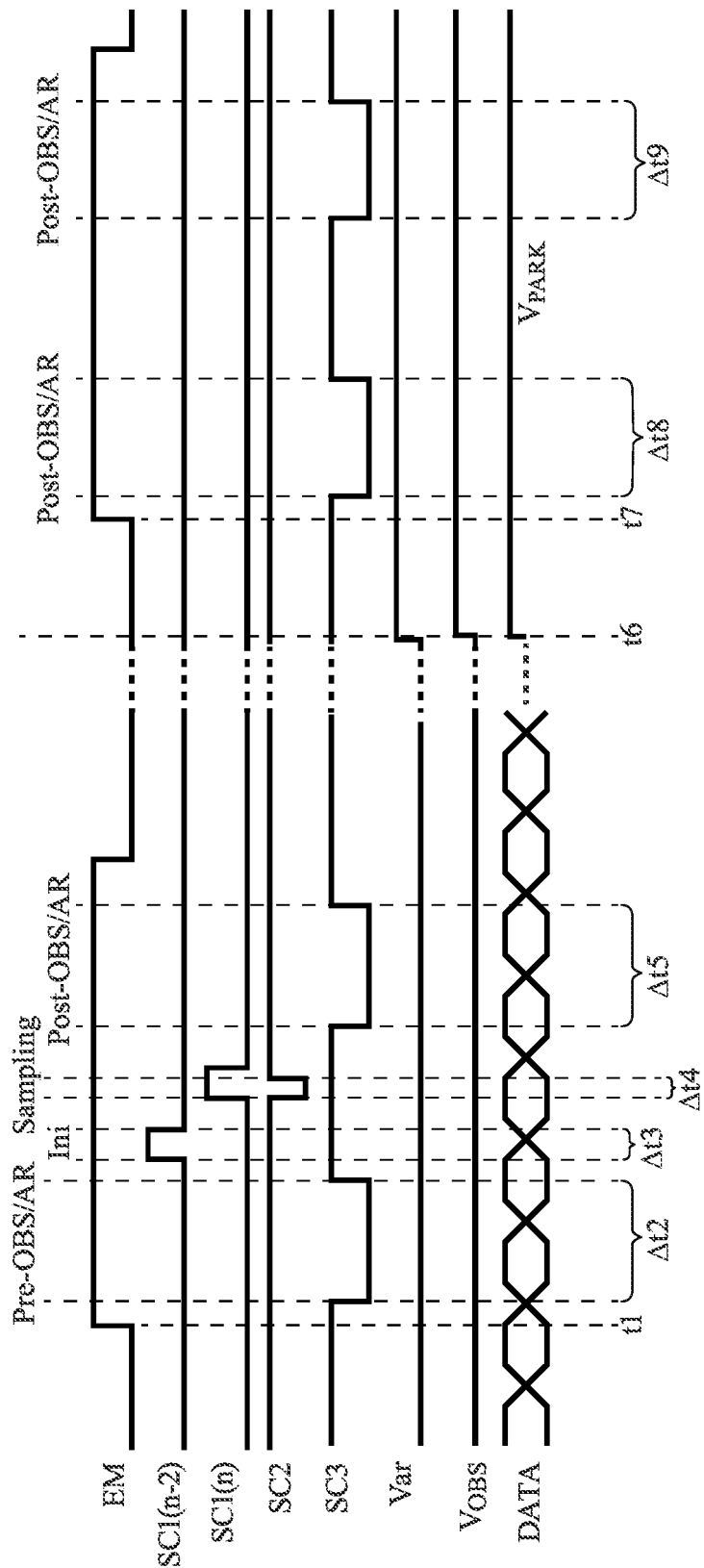
FIG. 18B is a timing diagram illustrating relevant waveforms for operating the pixel circuit shown in FIG. 18A in accordance with an embodiment.

FIG. 18B is a timing diagram illustrating the operation of pixel 22 shown in FIG. 18A. As shown in FIG. 18A, the operations prior to time t6 are performed during the active/refresh period, whereas the operations after time t6 are performed during the blanking period. At time t1, the emission signal EM may be deasserted (e.g., driven high) to begin the active period. During period Δt2, a pre-OBS/AR phase may be performed by selectively pulsing signal SC3(n). Asserting signal SC3(n) will turn on transistor Tobs to apply Vobs to the source terminal of the drive transistor and will also turn on transistor Tar to perform anode reset for the OLED.

During period Δt3, an initialization phase may be carried out by pulsing signal SC1(n−2) high while the other signals are deasserted. Driving signal SC1(n−2) high will turn on n-channel semiconducting-oxide transistor Tini to apply initialization voltage Vini to the gate terminal of the drive transistor. Signal SC3 is high at this time, so no anode reset will be performed during Δt3.

During period Δt4, a data programming/sampling phase may be performed by pulsing signal SC2 low while signal SC1(n) is still high and while signals SC3 and SC1(n−2) are deasserted. Driving signal SC2 low will turn on transistor Tdata to load the desired data signal onto the source terminal of the drive transistor while transistor Toxide is kept on to allow sampling of the threshold voltage Vth of the drive transistor.

During period Δt5, a post-OBS/AR phase may be performed by selectively pulsing signal SC3(n). Asserting signal SC3(n) will again turn on transistor Tobs to apply Vobs to the source terminal of the drive transistor and will also turn on transistor Tar to perform anode reset at the OLED.

If desired, anode reset voltage Var and the on-bias stress voltage Vobs may be adjusted at time t6 to help reduce any mismatch between the active and blanking periods. The voltage change in Var and Vobs at time t6 may be any suitable voltage delta to help compensate for any operational mismatch within pixel 22, thereby eliminating any residual flicker and closing any undesired luminance gaps when toggling between refresh and vertical blanking frames. At time t7, the emission signal EM may be deasserted (e.g., driven high) to begin the blanking period. During the blanking period, the data signals on the data line may be parked at some predetermined voltage level Vpark to help reduce dynamic power consumption. If desired, Vobs and Var can be different between the active and blanking periods. If desired, Vobs, Var, and Vpark may also be different between different blanking periods.

Note that the pre-OBS/AR phase during Δt2 and the post-OBS/AR phase during Δt5 in the active frame will add a first additional post-OBS/AR phase during Δt8 and a second additional post-OBS/AR phase during Δt9 in the blanking frame. During the blanking period, the pulsing of signal SC3 will serve to carry out at least two corresponding anode resets using the adjusted Var voltage. The driving scheme illustrated in connection with FIG. 18A/B may (as an example) be implemented using three gate drivers on each side of the pixel array, where the SC1, SC2, and SC3 signal drivers are formed on a first side of the array and where the SC1, SC2, and EM signal drivers are formed on a second side of the array, which is equivalent to only four total gate drivers.

Figure 19A:
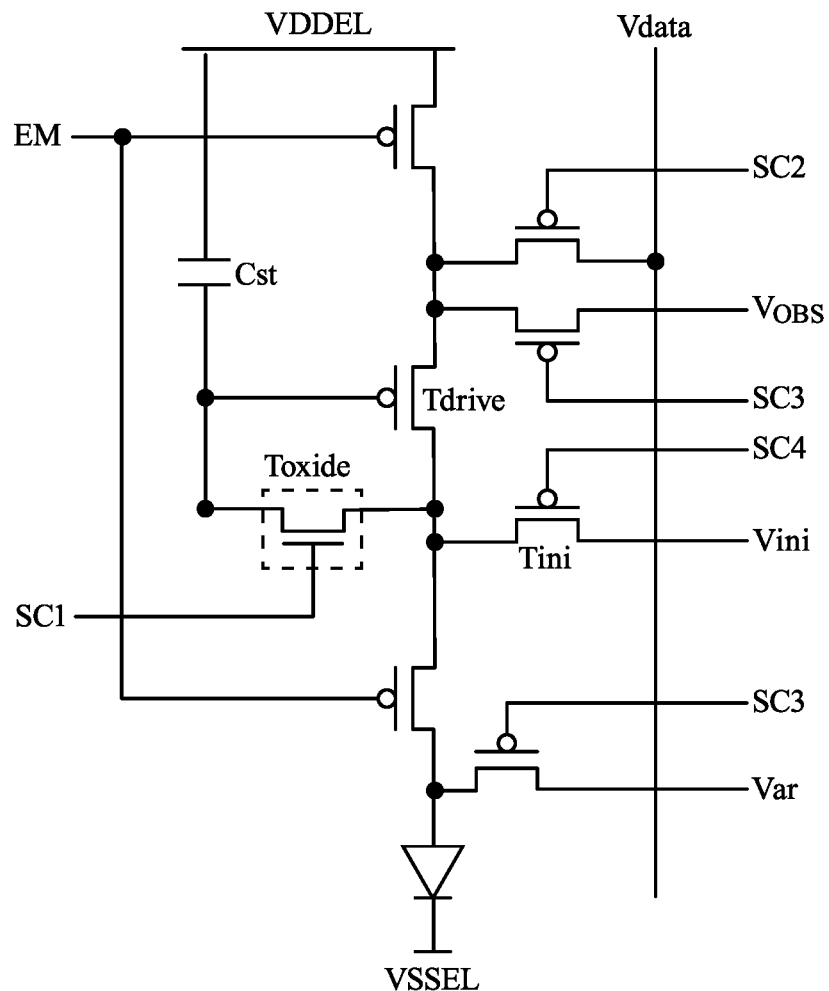
FIG. 19A is a circuit diagram of yet another suitable implementation of an illustrative display pixel circuit in accordance with an embodiment.

FIG. 19A illustrates yet another suitable implementation of display pixel 22. The pixel structure of FIG. 19A is similar to the pixel structure of FIG. 18A, except the initialization transistor Tini is now coupled to the drain terminal of the drive transistor. In particular, transistor Tini may have a first source-drain terminal connected to the drain terminal of the drive transistor, a gate terminal configured to receive fourth scan control signal SC4, and a second source-drain terminal connected to an initialization line on which initialization voltage Vini is provided. Unlike the example of FIG. 18A, transistor Tini of FIG. 19A may be implemented as a p-channel silicon transistor. The example of FIG. 19A in which only transistor Toxide is implemented using an n-type semiconducting-oxide transistor while the remaining transistors are implemented using p-type silicon transistors is merely illustrative. If desired, transistor Toxide may alternatively be implemented as a p-type semiconducting-oxide transistor; transistor Tini may be implemented as an n-type or p-type semiconducting-oxide transistor; any one or more of the other transistors Tem1, Tem2, Tdrive, Tdata, Tar, and/or Tobs may be implemented as n-type or p-type semiconducting-oxide transistors or n-type silicon transistors; pixel 22 may include more than eight or less than eight transistors; pixel 22 may include more than one capacitor, etc.

Figure 19B:
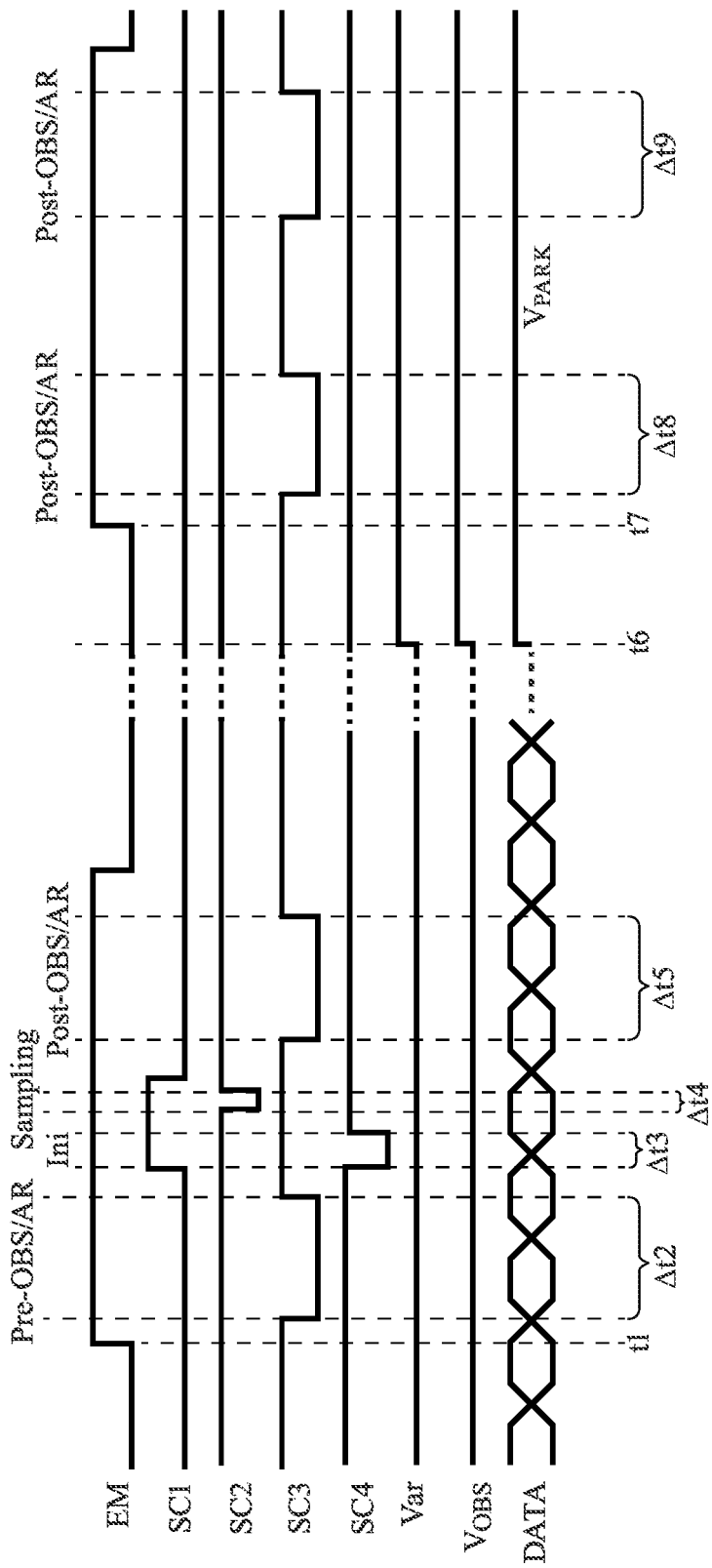
FIG. 19B is a timing diagram illustrating relevant waveforms for operating the pixel circuit shown in FIG. 19A in accordance with an embodiment.

FIG. 19B is a timing diagram illustrating the operation of pixel 22 shown in FIG. 19A. As shown in FIG. 19A, the operations prior to time t6 are performed during the active/refresh period, whereas the operations after time t6 are performed during the blanking period. At time t1, the emission signal EM may be deasserted (e.g., driven high) to begin the active period. During period Δt2, a pre-OBS/AR phase may be performed by selectively pulsing signal SC3(n). Asserting signal SC3(n) will turn on transistor Tobs to apply Vobs to the source terminal of the drive transistor and will also turn on transistor Tar to perform anode reset for the OLED.

During period Δt3, an initialization phase may be carried out by pulsing signal SC4 low while signal SC1 is high. Driving signal SC4 low will turn on p-channel silicon transistor Tini to apply initialization voltage Vini to the drain terminal of the drive transistor. Signal SC3 is high at this time, so no anode reset will be performed during Δt3.

During period Δt4, a data programming/sampling phase may be performed by pulsing signal SC2 low while signal SC1 is still high and while signals SC3 and SC4 are deasserted. Driving signal SC2 low will turn on transistor Tdata to load the desired data signal onto the source terminal of the drive transistor while transistor Toxide is kept on (since SC1 is high) to allow sampling of the threshold voltage Vth of the drive transistor.

During period Δt5, a post-OBS/AR phase may be performed by selectively pulsing signal SC3(n). Asserting signal SC3(n) will again turn on transistor Tobs to apply Vobs to the source terminal of the drive transistor and will also turn on transistor Tar to perform anode reset at the OLED.

If desired, anode reset voltage Var and the on-bias stress voltage Vobs may be adjusted at time t6 to help reduce any mismatch between the active and blanking periods. The voltage change in Var and Vobs at time t6 may be any suitable voltage delta to help compensate for any operational mismatch within pixel 22, thereby eliminating any residual flicker and closing any undesired luminance gaps when toggling between refresh and vertical blanking frames. At time t7, the emission signal EM may be deasserted (e.g., driven high) to begin the blanking period. During the blanking period, the data signals on the data line may be parked at some predetermined voltage level Vpark to help reduce dynamic power consumption. If desired, Vobs and Var can be different between the active and blanking periods. If desired, Vobs, Var, and Vpark may also be different between different blanking periods.

Note that the pre-OBS/AR phase during Δt2 and the post-OBS/AR phase during Δt5 in the active frame will add a first additional post-OBS/AR phase during Δt8 and a second additional post-OBS/AR phase during Δt9 in the blanking frame. During the blanking period, the pulsing of signal SC3 will serve to carry out at least two corresponding anode resets using the adjusted Var voltage. The driving scheme illustrated in connection with FIG. 19A/B may (as an example) be implemented using three gate drivers on each side of the pixel array, where the SC2, SC3, and SC4 signal drivers are formed on a first side of the array and where the SC1, SC2, and EM signal drivers are formed on a second side of the array, which is equivalent to five total gate drivers.

Figure 20A:
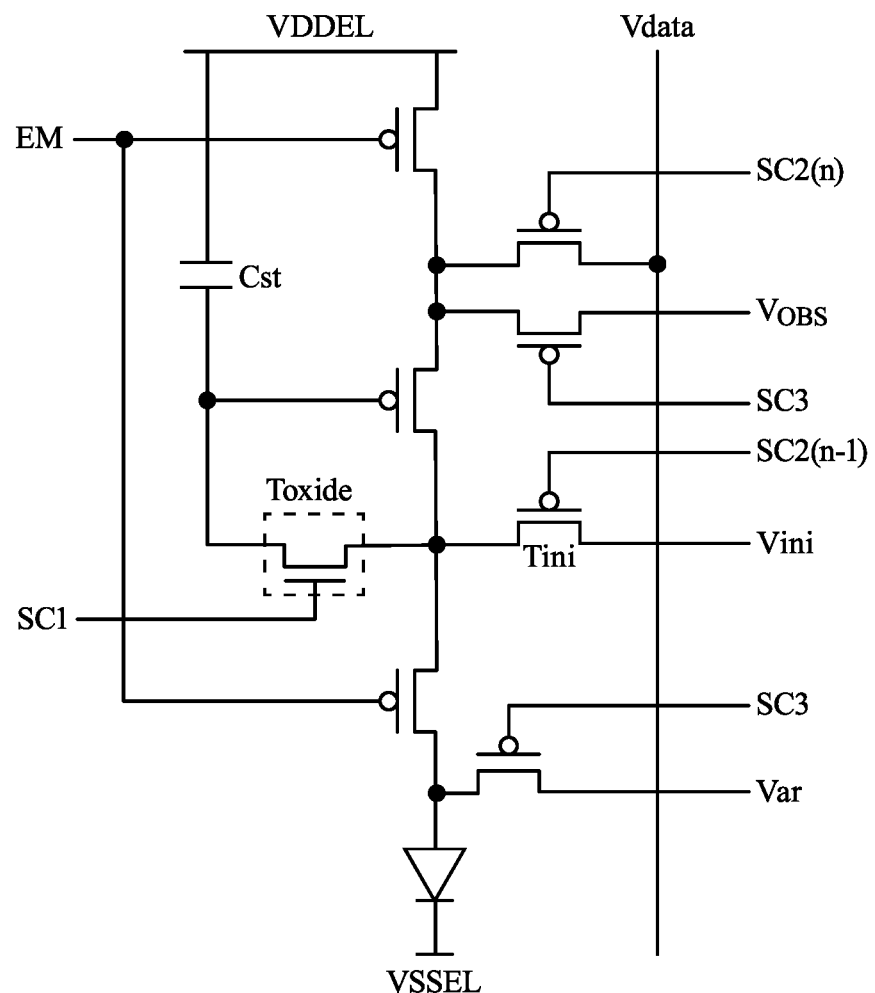
FIG. 20A is a circuit diagram of yet another suitable implementation of an illustrative display pixel circuit in accordance with an embodiment.
Figure 20B:
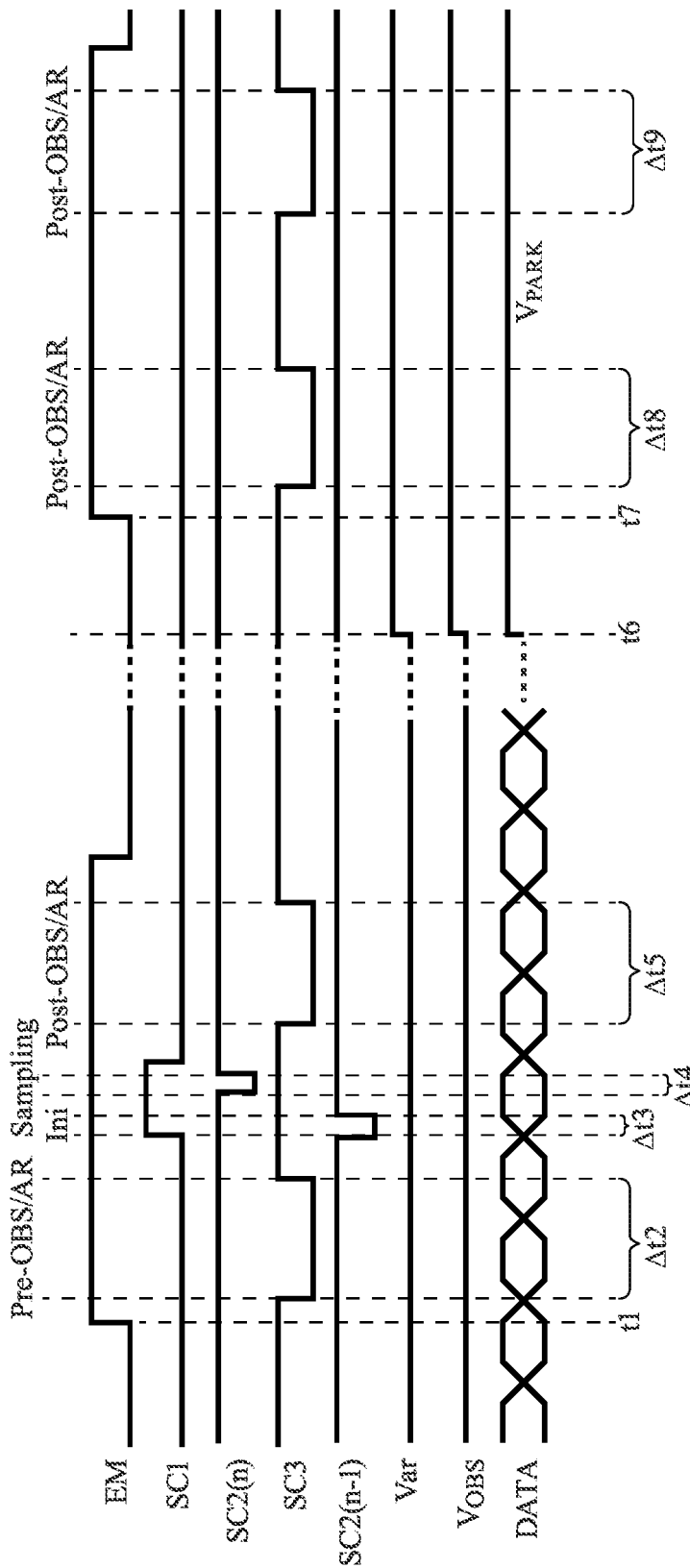
FIG. 20B is a timing diagram illustrating relevant waveforms for operating the pixel circuit shown in FIG. 20A in accordance with an embodiment.

FIG. 20A illustrates yet another suitable implementation of display pixel 22. The pixel structure of FIG. 20A is similar to the pixel structure of FIG. 19A, except the initialization transistor Tini is now controlled by SC2(n−1), a SC2 signal from one row above. FIG. 20B is a timing diagram illustrating the operation of pixel 22 shown in FIG. 20A. As shown in FIG. 20A, the operations prior to time t6 are performed during the active/refresh period, whereas the operations after time t6 are performed during the blanking period. At time t1, the emission signal EM may be deasserted (e.g., driven high) to begin the active period. During period Δt2, a pre-OBS/AR phase may be performed by selectively pulsing signal SC3(n). Asserting signal SC3(n) will turn on transistor Tobs to apply Vobs to the source terminal of the drive transistor and will also turn on transistor Tar to perform anode reset for the OLED.

During period Δt3, an initialization phase may be carried out by pulsing signal SC2(n−1) low while signal SC1 is high. Driving signal SC2(n−1) low will turn on p-channel silicon transistor Tini to apply initialization voltage Vini to the drain terminal of the drive transistor. Signal SC3 is high at this time, so no anode reset will be performed during Δt3.

During period Δt4, a data programming/sampling phase may be performed by pulsing signal SC2(n) low while signal SC1 is still high and while signals SC3 and SC2(n−1) are deasserted. Driving signal SC2(n) low will turn on transistor Tdata to load the desired data signal onto the source terminal of the drive transistor while transistor Toxide is kept on (since SC1 is high) to allow sampling of the threshold voltage Vth of the drive transistor.

During period Δt5, a post-OBS/AR phase may be performed by selectively pulsing signal SC3(n). Asserting signal SC3(n) will again turn on transistor Tobs to apply Vobs to the source terminal of the drive transistor and will also turn on transistor Tar to perform anode reset at the OLED.

If desired, anode reset voltage Var and the on-bias stress voltage Vobs may be adjusted at time t6 to help reduce any mismatch between the active and blanking periods. The voltage change in Var and Vobs at time t6 may be any suitable voltage delta to help compensate for any operational mismatch within pixel 22, thereby eliminating any residual flicker and closing any undesired luminance gaps when toggling between refresh and vertical blanking frames. At time t7, the emission signal EM may be deasserted (e.g., driven high) to begin the blanking period. During the blanking period, the data signals on the data line may be parked at some predetermined voltage level Vpark to help reduce dynamic power consumption. If desired, Vobs and Var can be different between the active and blanking periods. If desired, Vobs, Var, and Vpark may also be different between different blanking periods.

Note that the pre-OBS/AR phase during Δt2 and the post-OBS/AR phase during Δt5 in the active frame will add a first additional post-OBS/AR phase during Δt8 and a second additional post-OBS/AR phase during Δt9 in the blanking frame. The driving scheme illustrated in connection with FIG. 20A/B may (as an example) be implemented using three gate drivers on each side of the pixel array, where the SC1, SC2, and SC3 signal drivers are formed on a first side of the array and where the SC1, SC2, and EM signal drivers are formed on a second side of the array, which is equivalent to four total gate drivers.

Figure 21A:
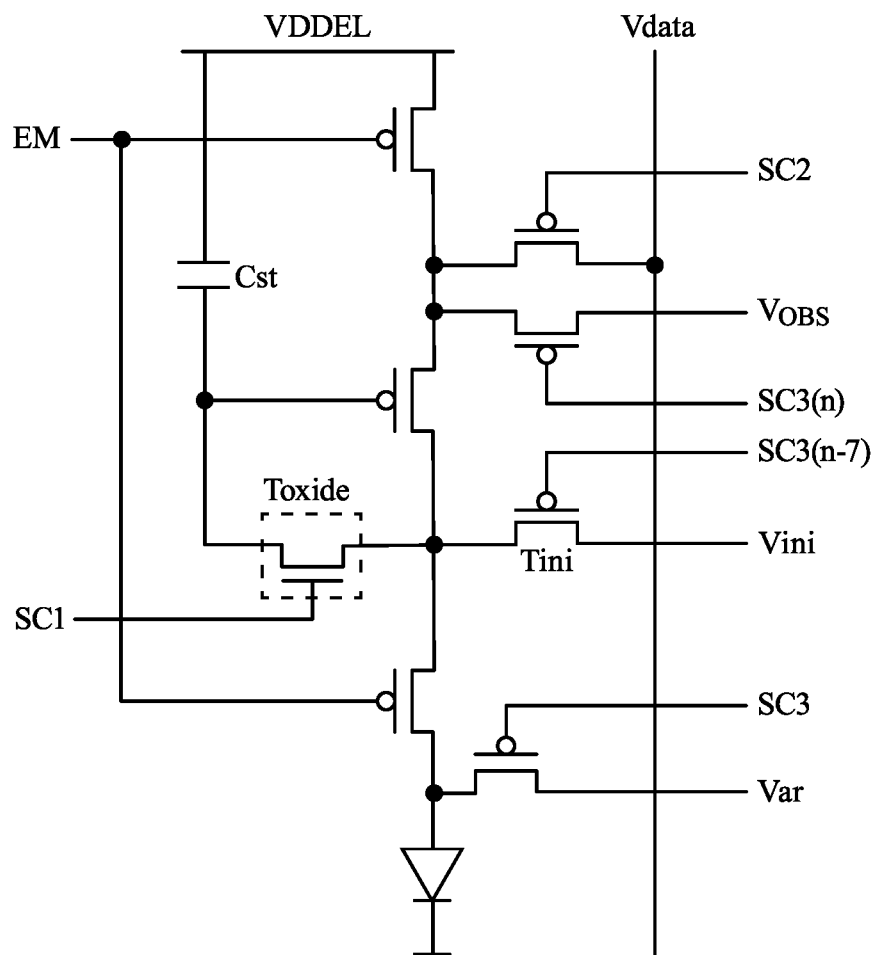
FIG. 21A is a circuit diagram of yet another suitable implementation of an illustrative display pixel circuit in accordance with an embodiment.
Figure 21B:
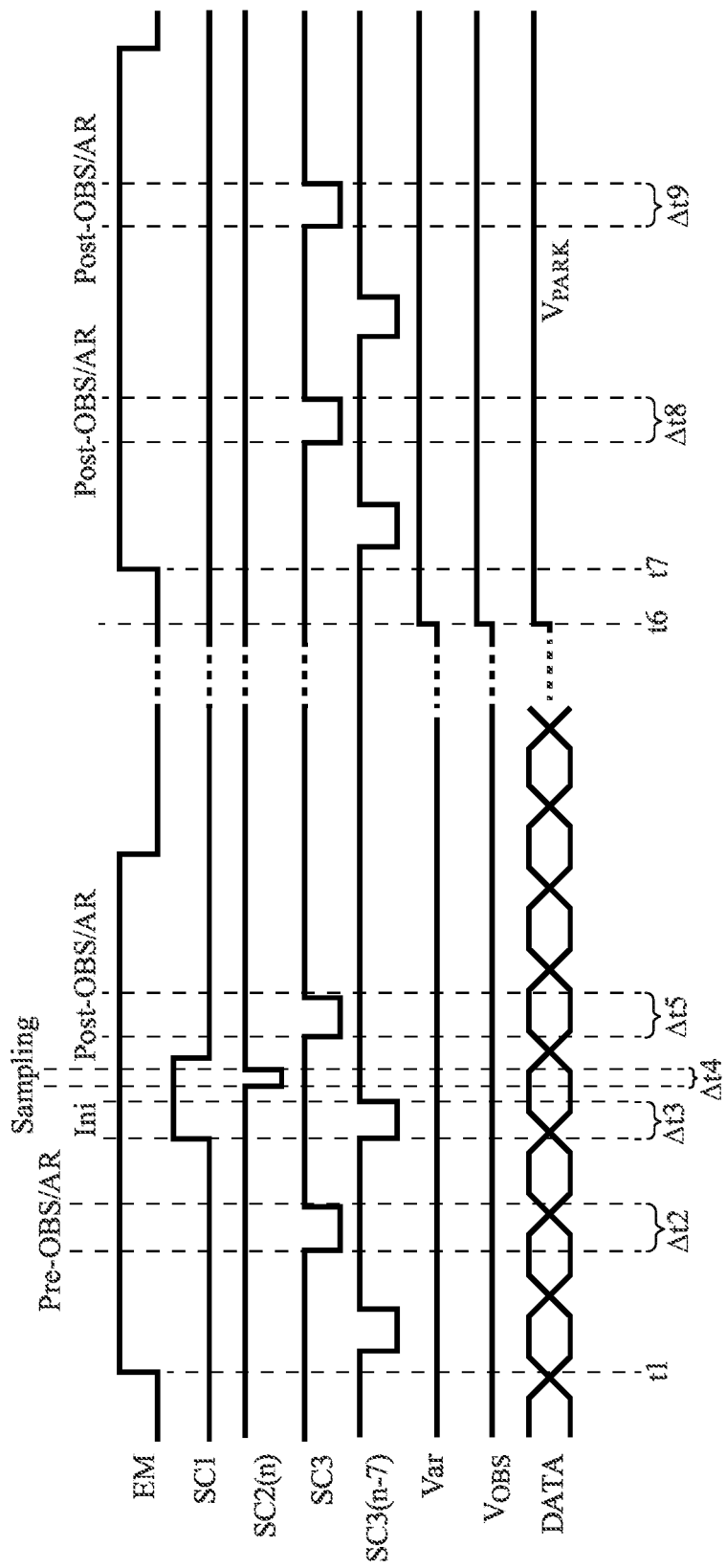
FIG. 21B is a timing diagram illustrating relevant waveforms for operating the pixel circuit shown in FIG. 21A in accordance with an embodiment.

FIG. 21A illustrates yet another suitable implementation of display pixel 22. The pixel structure of FIG. 21A is similar to the pixel structure of FIG. 19A, except the initialization transistor Tini is now controlled by SC3(n−7), a SC3 signal from seven rows above. FIG. 21B is a timing diagram illustrating the operation of pixel 22 shown in FIG. 21A. As shown in FIG. 21A, the operations prior to time t6 are performed during the active/refresh period, whereas the operations after time t6 are performed during the blanking period. At time t1, the emission signal EM may be deasserted (e.g., driven high) to begin the active period. During period Δt2, a pre-OBS/AR phase may be performed by selectively pulsing signal SC3(n). Asserting signal SC3(n) will turn on transistor Tobs to apply Vobs to the source terminal of the drive transistor and will also turn on transistor Tar to perform anode reset for the OLED.

During period Δt3, an initialization phase may be carried out by pulsing signal SC3(n−7) low while signal SC1 is high. Driving signal SC3(n−7) low will turn on p-channel silicon transistor Tini to apply initialization voltage Vini to the drain terminal of the drive transistor. Signal SC3 is high at this time, so no anode reset will be performed during Δt3.

During period Δt4, a data programming/sampling phase may be performed by pulsing signal SC2(n) low while signal SC1 is still high and while signals SC3 and SC3(n−7) are deasserted. Driving signal SC2(n) low will turn on transistor Tdata to load the desired data signal onto the source terminal of the drive transistor while transistor Toxide is kept on (since SC1 is high) to allow sampling of the threshold voltage Vth of the drive transistor.

During period Δt5, a post-OBS/AR phase may be performed by selectively pulsing signal SC3(n). Asserting signal SC3(n) will again turn on transistor Tobs to apply Vobs to the source terminal of the drive transistor and will also turn on transistor Tar to perform anode reset at the OLED.

If desired, anode reset voltage Var and the on-bias stress voltage Vobs may be adjusted at time t6 to help reduce any mismatch between the active and blanking periods. The voltage change in Var and Vobs at time t6 may be any suitable voltage delta to help compensate for any operational mismatch within pixel 22, thereby eliminating any residual flicker and closing any undesired luminance gaps when toggling between refresh and vertical blanking frames. At time t7, the emission signal EM may be deasserted (e.g., driven high) to begin the blanking period. During the blanking period, the data signals on the data line may be parked at some predetermined voltage level Vpark to help reduce dynamic power consumption. If desired, Vobs and Var can be different between the active and blanking periods. If desired, Vobs, Var, and Vpark may also be different between different blanking periods.

Note that the pre-OBS/AR phase during Δt2 and the post-OBS/AR phase during Δt5 in the active frame will add a first additional post-OBS/AR phase during Δt8 and a second additional post-OBS/AR phase during Δt9 in the blanking frame. The driving scheme illustrated in connection with FIG. 21A/B may (as an example) be implemented using three gate drivers on each side of the pixel array, where the SC1, SC2, and SC3 signal drivers are formed on a first side of the array and where the SC1, SC2, and EM signal drivers are formed on a second side of the array, which is equivalent to four total gate drivers.

The embodiments of FIGS. 1-21 describing display pixels 22 operable to support in-pixel Vth canceling and external current sensing are merely illustrative and are not intended to limit the scope of the present embodiments. In general, pixels 22 may be modified to include more than seven or less than seven thin-film transistors and can include more or less capacitors. The polarity of any of the pixel transistors can be flipped (e.g., p-type transistors can instead be implemented using n-type transistors and vice versa). More than one emission control signal can be used per row (e.g., transistor Tem1 might be controlled using a first emission signal EM1, whereas transistor Tem2 might be controlled using a second separate emission signal EM2). More than two or less than two scan control signal can be used per row, where each scan control signal can optionally be shared among two or more neighboring rows of display pixels. If desired, other ways of implementing on-bias stress in high refresh rate or low refresh rate display can be adopted to mitigate the impact of hysteresis and minimize flicker.

The foregoing is merely illustrative and various modifications can be made by those skilled in the art without departing from the scope and spirit of the described embodiments. The foregoing embodiments may be implemented individually or in any combination.

What is claimed is:

1. A method of operating a display pixel having a light-emitting diode, a drive transistor, at least one emission transistor, and an anode reset transistor coupled to an anode of the light-emitting diode, the method comprising:
during a refresh period, deactivating the at least one emission transistor and setting an anode reset voltage for the anode reset transistor to a first voltage level;
during an emission period after the refresh period, activating the at least one emission transistor; and
during a blanking period after the emission period, deactivating the at least one emission transistor and pulsing the anode reset voltage at least once to a second voltage level different than the first voltage level. period.

2. The method of claim 1, further comprising:
pulsing the anode reset voltage at least twice during the blanking period.

3. The method of claim 1, wherein the display pixel further includes a data loading transistor configured to receive a data line voltage, the method further comprising:
during the blanking period, reducing power consumption of the display pixel by setting the data line voltage to a predetermined voltage level.

4. The method of claim 1, wherein the display pixel further includes a data loading transistor and a bias transistor that is configured to receive a bias voltage, the method further comprising:
during the refresh period, activating the data loading transistor; and
temporarily activating the bias transistor before activating the data loading transistor during the refresh period.

5. The method of claim 4, further comprising:
temporarily activating the bias transistor after activating the data loading transistor during the refresh period.

6. The method of claim 4, wherein the display pixel further includes an initialization transistor configured to receive an initialization voltage, the method further comprising:
temporarily activating the initialization transistor after activating the bias transistor and before activating the data loading transistor.

7. The method of claim 4, further comprising:
activating the bias transistor at least once during the blanking period.

8. The method of claim 4, further comprising:
activating the bias transistor at least twice during the blanking period.

9. The method of claim 4, further comprising:
setting the bias voltage to a third voltage level during the refresh period; and
setting the bias voltage to a fourth voltage level different than the third voltage level during the blanking period.

10. A method of operating a display pixel having a light-emitting diode, a drive transistor, at least one emission transistor, and a bias transistor directly coupled to the drive transistor and configured to receive a bias voltage, the method comprising:
during a refresh period, deactivating the at least one emission transistor and activating the bias transistor at least once;
during an emission period after the refresh period, activating the at least one emission transistor; and
during a blanking period after the emission period, deactivating the at least one emission transistor and activating the bias transistor at least once.

11. The method of claim 10, further comprising:
activating the bias transistor at least twice during the refresh period.

12. The method of claim 11, further comprising:
activating the bias transistor at least twice during the blanking period.

13. The method of claim 10, further comprising:
activating the bias transistor a given number of times during the refresh period; and
activating the bias transistor the given number of times during the blanking period.

14. The method of claim 10, further comprising:
setting the bias voltage to a first voltage level during the refresh period; and
setting the bias voltage to a second voltage level different than the first voltage level during the blanking period.

15. The method of claim 10, wherein the display pixel further includes an anode reset transistor coupled to an anode of the light-emitting diode and includes an initialization transistor coupled to a gate terminal of the drive transistor, the method further comprising:
setting an anode reset voltage that is provided to the anode reset transistor to a fixed voltage level during the refresh period; and adjusting the anode reset voltage from the fixed voltage level to a different voltage level during the blanking period.

16. A method of operating a display pixel having a light-emitting diode, a drive transistor, at least one emission transistor, a data loading transistor, an anode reset transistor coupled to an anode of the light-emitting diode, and a bias transistor configured to receive a bias voltage, the method comprising:

during a refresh period, deactivating the at least one emission transistor and simultaneously activating the anode reset transistor and the bias transistor;

during an emission period after the refresh period, activating the at least one emission transistor; and during a blanking period after the emission period, deactivating the at least one emission transistor and simultaneously activating the anode reset transistor and the bias transistor.

17. The method of claim 16, further comprising:
setting an anode reset voltage that is provided to the anode reset transistor to a fixed voltage level during the refresh period; and
adjusting the anode reset voltage from the fixed voltage level to a different voltage level during the blanking period.

18. The method of claim 16, further comprising:
setting the bias voltage to a first voltage level during the refresh period; and
setting the bias voltage to a second voltage level different than the first voltage level during the blanking period.

19. The method of claim 16, further comprising:
providing a first scan line signal to a semiconducting-oxide transistor coupled to a gate terminal of the drive transistor;
providing a second scan line signal to the data loading transistor; and
providing a third scan line signal to the anode reset transistor and the bias transistor.

* * * * *

UNITED STATES PATENT AND TRADEMARK OFFICE
CERTIFICATE OF CORRECTION

PATENT NO. : 11,887,546 B2
APPLICATION NO. : 18/192905
DATED : January 30, 2024
INVENTOR(S) : Chin-Wei Lin et al.

It is certified that error appears in the above-identified patent and that said Letters Patent is hereby corrected as shown below:

In the Claims

Column 25, Line 58, "period." should be removed.

Signed and Sealed this
Twelfth Day of November, 2024

Katherine Kelly Vidal
*Director of the United States Patent and Trademark Office*